United States Patent
Hennig et al.

(10) Patent No.: US 8,749,358 B2
(45) Date of Patent: Jun. 10, 2014

(54) PASSIVE TRANSPONDER FOR AN RFID SYSTEM, AND METHOD OF TRANSMITTING DATA FROM/TO A DATA SOURCE OF SUCH A PASSIVE TRANSPONDER

(75) Inventors: Andreas Hennig, Muehlheim (DE); Gerd Vom Boegel, Wuelfrath (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 680 days.

(21) Appl. No.: 12/958,612

(22) Filed: Dec. 2, 2010

(65) Prior Publication Data

US 2011/0133894 A1    Jun. 9, 2011

(30) Foreign Application Priority Data

Dec. 3, 2009   (EP) ..................................... 09015003
May 14, 2010   (DE) .......................... 10 2010 028 991

(51) Int. Cl.
*G08C 19/02*   (2006.01)

(52) U.S. Cl.
USPC ........ 340/13.37; 340/10.1; 340/1.1; 343/745; 343/748

(58) Field of Classification Search
USPC ............................................. 340/10.1, 572.5
See application file for complete search history.

(56) References Cited

U.S. PATENT DOCUMENTS

| 2,887,650 | A | 5/1959 | Ruddock et al. |
| 3,614,600 | A | 10/1971 | Ronka |
| 4,201,960 | A * | 5/1980 | Skutta et al. ................. 333/17.3 |
| 5,541,604 | A | 7/1996 | Meier |
| 6,317,027 | B1 * | 11/2001 | Watkins ....................... 340/10.1 |
| 7,079,084 | B2 | 7/2006 | Notohara et al. |
| 2005/0029919 | A1 | 2/2005 | Notohara et al. |
| 2005/0104781 | A1 | 5/2005 | Notohara et al. |
| 2009/0026266 | A1 | 1/2009 | Raggam |
| 2009/0195366 | A1 | 8/2009 | Meier et al. |

FOREIGN PATENT DOCUMENTS

| DE | 694 23 474 T2 | 9/2000 |
| DE | 11 2004 002 040 T5 | 9/2006 |
| DE | 10 2007 019 672 A1 | 8/2008 |
| DE | 10 2008 034 001 A1 | 1/2009 |
| DE | 10 2007 049 486 A1 | 4/2009 |
| EP | 1 696 362 B1 | 7/2008 |

OTHER PUBLICATIONS

Hennig et al., "Antenna Arrangement and Transponder Reader", U.S. Appl. No. 13/023,577, filed on Feb. 9, 2011.
Jung et al., "A Dual Band Wireless Power and FSK Data Telemetry for Biomedical Implants", Proceedings of the 29th Annual International Conference of the IEEE EMBS, Aug. 23-26, 2007, pp. 6596-6599.
Finkenzeller, "RFID Handbook", 1999, Wiley & Sons Ltd, 11 pages.
Hennig et al., "Antenna Device, Transponder Reader, Induction Cooker," U.S. Appl. No. 13/107,033, filed May 13, 2011.

\* cited by examiner

*Primary Examiner* — Daniel Wu
*Assistant Examiner* — Frederick Ott
(74) *Attorney, Agent, or Firm* — Keating & Bennett, LLP

(57) ABSTRACT

A passive transponder includes an antenna, an antenna oscillator circuit and a data source. The antenna oscillator circuit is configured to operate at a first resonant frequency or at a second resonant frequency, depending on reception of energy at the transponder or on a data transmission from/to the data source.

12 Claims, 19 Drawing Sheets

PASSIVE TRANSPONDER FOR AN RFID SYSTEM, AND METHOD OF TRANSMITTING DATA FROM/TO A DATA SOURCE OF SUCH A PASSIVE TRANSPONDER

CROSS-REFERENCE TO RELATED APPLICATIONS

This application claims priority from German Patent Application No. 102010028991.4, which was filed on May 14, 2010, and is incorporated herein in its entirety by reference.

The present invention generally relates to the field of RFID (Radio Frequency IDentification) technology, and in particular to a passive transponder employed within such a system. Embodiments of the invention relate to so-called sensor transponders employed in medical technology, for example.

BACKGROUND OF THE INVENTION

Transponder systems are applied in an increasing number of fields; specifically sensor transponders are of interest here. The combination of RFID technology and sensor technology opens up new possibilities in many technological fields, for example in medical technology. In medical technology applications, sensor transponder technology opens up valuable possibilities of treating diseases of the cardiovascular system in humans, such as cardiac insufficiency. However, miniaturized sensor transponder systems passively supplied with power may also be employed, and are of great interest, in other technical fields, e.g. in the fields of construction physics, chemical industry and automobile industry. In construction physics, their utilization is feasible for monitoring the level of humidity in wood constructions or the insulating properties of so-called vacuum insulation panels. In the chemical industry, pH values in liquids may be monitored. In electric vehicles, such miniaturized transponders introduced into batteries might monitor temperatures and pressures and thereby increase safety.

However, it has been found that the RFID transmission technique is not well suited for sensor transponders since the higher current requirement of such a transponder, the useful broad range of transmission at small dimensions, and possibly existing lossy materials that might surround the transponder set limits to the RFID technique. Even though several sensor transponders have already been known, their range of transmission is small, so that their application possibilities are limited.

FIG. 1 shows a schematic representation of a known sensor transponder system comprising a passive transponder, implanted into a patient's body, for providing measurement signals. By reference to such a system, the disadvantages of conventional passive transponders shall be discussed below, said disadvantages occurring, in particular, in environments where the transponder is surrounded by lossy materials, such as human tissue, for example. In the context of such applications, medical studies have shown that the treatment of cardiovascular diseases may be clearly improved by constant monitoring of parameters, such as blood pressure, temperature, etc. Constant monitoring of cardiovascular functions supports the optimum adjustment of drug dosage for a patient. Sensor transponders implanted into a human body may therefore support and, thus, considerably improve a therapy. Said transponders may be located at different positions inside the body and may monitor the performance of the cardiovascular system. So-called passive transponder systems are of particular interest in this context, since the above-mentioned transponders typically remain inside a patient's body for a relatively long period of time, and therefore, conventional power supply by means of a local battery is not possible. More specifically, for active transponder systems it would be useful to provide large batteries that enable energy supply over a sufficiently long period of time. Due to the available transponder dimensions, this is typically not possible at all. Alternatively, the implanted transponders might be replaced or removed after a predetermined time period and be fitted with new batteries, which is undesirable, however, since this would involve unnecessary interventions for the patients. Thus, utilization of transponders which have a local battery is not desirable in this field. In medical technology applications it is desirable, in particular, to design the dimensions of the transponder such that so-called catheter implantation is possible, i.e. a minimally invasive approach to inserting the transponder into the human body. Consequently, antennas may be used which have the shape of a rod and have a size of only few millimeters. Such transponders, which comprise the useful sensor technology for detecting the desired parameters, consume considerably more energy than conventional ID transponders as are employed in conventional RFID systems.

Unlike conventional RFID systems, the maximally possible distance between the reader and the implanted transponder is also to be considered, so that such systems are also suitable for corpulent patients. Data transmission may be realized over the useful distance and at the useful data rate. For example, to obtain a meaningful medical diagnosis, it may be ensured that a pressure development may be transmitted for a duration of several heartbeats.

As was already mentioned above, FIG. 1 shows a conventional transponder system as is already employed today in medical technology applications. The system comprises a passive transponder 100 implanted into the body of a patient 102, as is schematically shown in FIG. 1. The transponder 100 comprises an antenna 104 having a corresponding antenna inductance $L_T$. A capacitor $C_T$ is connected in parallel with the antenna 104. A series connection consisting of the resistor R and the switching element 106 is further arranged in parallel with the antenna 104 and with the capacitor $C_T$. The switching element 106 is a transistor, for example, that connects or disconnects the resistor R in parallel with the antenna 104, depending on a control signal that is present and is provided via a line 108. In addition, the transponder 100 comprises the chip 110 depicted in FIG. 1, whose inputs are connected to the antenna 104 via corresponding connections 112 and 114. Said connections have, firstly, the capacitor $C_T$ and, secondly, the series connection consisting of the resistor R and the switching element 106 arranged therebetween. The chip 110 comprises the sensor technology, not depicted in detail in FIG. 1, for detecting the desired parameters of the patient 102, and the useful processing electronics for processing said parameters for transmission. The chip 110 further comprises a controller for providing, via the line 108, corresponding control signals for controlling the switching element 106 for a load modulation, which will be explained in more detail below.

The transponder system further comprises a reader 120, which also comprises an antenna 122. The antenna 122 of the reader 120 is fed by a voltage supply 124 connected to the antenna 122 via the lines 126 and 128. A resistor R is arranged within the line 126. In addition, lines 130 and 132, which are connected to corresponding inputs of a receiver 134, branch off from the line 126. The line 132 comprises a capacitor C connected between the lines 126 and 128 and, thus, in parallel with the antenna 122.

The region 136 depicted in dashed lines in FIG. 1 (also referred to as a transmission channel) schematically represents that region within which energy is transmitted from the reader 120 to the transponder 100. More specifically, the reader 120, which is located outside the body of the patient 102, generates an alternating magnetic field $B_R$ which penetrates the human body 102. Part of the magnetic flux establishes a coupling to the antenna coil 104 of the sensor transponder 100. As a result, a voltage which supplies the transponder chip 110 with energy is induced within the transponder 100. The parallel resonant circuit consisting of the antenna inductance $L_T$, the capacitor $C_T$ and the resistor R enables exploitation of the effect of the increase in resonance and results in efficiency improvement. The reactive current $I_T$ leads to a magnetic field $B_T$ with opposite orientation, so that the voltage across the reader coil, or reader antenna, 122 is attenuated.

The transponder system described by means of FIG. 1 uses so-called load modulation in order to transmit data back to the reader 120. For this purpose, the resistor R is provided, which may be optionally connected as a load, via the switching element 106, to the resonant circuit consisting of the antenna inductance $L_T$ and the capacitor $C_T$. In this manner, the reactive current $I_T$ and the magnetic field strength at the transponder 100 may be changed. This change is detected at the antenna 122 of the reader 120 by the receiver 134. In practice, this change is relatively small as compared to the field $B_R$ of the reader 120 and as compared to the noise.

In transponder systems, one differentiates between two ranges; firstly, the so-called energy range, and secondly, the so-called data range. The energy range characterizes the maximum distance at which the transponder 100 may be provided with sufficient energy to function properly. The reading range characterizes the maximum distance at which the reader 120 may receive data signals from the transponder 100. With simple ID transponder applications, the reading range is typically much smaller than the energy range, but in the example depicted in FIG. 1 both distances may be at least up to 40 cm.

The discussion which follows shows that conventional transponder systems as are shown in FIG. 1 are unsuitable. The dimensions of a transponder antenna implantable by means of catheters are limited to 2 mm×8 mm. During transmission of the energy through the human tissue, there will naturally be losses, and both the energy losses and the limited dimension of the antenna will result in that the so-called mutual inductance between the antennas 104 and 122 is reduced. The mutual inductance describes the magnetic coupling between the reader 120 and the transponder antenna 104, so that reduction of the mutual inductance consequently also implies a reduction of the maximally possible distance between the transponder 100 and the reader 102. As was mentioned, the desired distance in medical technology applications is advantageously 40 cm. Transmission of the energy from the reader 120 to the transponder 100 is useful over said distance in order to enable the transponder to function.

Such an energy range may be achieved in that the antenna structures are optimized and in that, in addition, a correspondingly high level of transmission power is employed. In one example, the transponder antenna 104 may comprise a 1.5 mm×8 mm ferrite rod which has 20 windings of a wire. The antenna 112 within the reader 120 may have a winding of a diameter of 26 cm and consist of a 2.5 cm copper tubing or a 3 cm copper tape, for example. At a frequency of 6.78 MHz it is possible to achieve good results in terms of energy transmission. Good results are also achievable at 13.56 MHz. The frequencies mentioned represent a fair compromise between loss effects inside a human body and the antennas; however, said loss effects also increase as frequencies increase. In addition, for higher frequencies, higher voltages are induced within the transponder 100, it being useful, for example, for ensuring sufficient supply of a transponder chip 110, to provide a voltage amplitude of 240 V across the reader antenna 112.

The sensor transponder 100 is to measure several physical parameters, e.g. blood pressure, temperature, and the supply voltage within the transponder. To enable medical diagnosis, it is desirable to transmit the pressure development of heartbeats at a sufficient resolution. Typically, a pressure ranging from 750 hPa to 1150 hPa may be assumed, the resolution intended to be ±1.3332 hPa. In addition, negative effects of subsequent signal processing are to be taken into account, such as quantization of the signal received within the receiver 134 by an analog-to-digital converter and, in this context, in particular the noise, so that a resolution of, e.g., 10 bits, which corresponds to about 1024 stages, is to be used. To reconstruct the pulse shape of the heart pressure in the reader 120, a time resolution of 100 samples per second is useful, which corresponds to a sampling interval of 10 ms. In addition, a temperature value is to be detected, e.g. with a resolution of 8 bits. The internal temperature of the human body is more or less constant, so that, here, a sampling rate of 1 per second is sufficient. Also, a voltage of the power supply 124 may be known, since the sensors within the transponder 100 are dependent on the voltage. Thus, measurement data with regard to the temperature at a resolution of 8 bits may be taken 10 times per second, so that, together with the data rate for the pressure values, an overall data rate adds up to about 2.09 kbit/s. Moreover, the transmission protocol exhibits a certain complexity, which may also be taken into account. Due to power restrictions, parallel measurement of data transmission may not be possible in some sensor transponders as are known in conventional technology, so that higher data rates are useful in such a case. For the following deliberation, a data rate of 13 kbit/s shall be assumed.

The above-mentioned reading range of the transponder is limited by several factors. The magnetic coupling between the antennas 104 and 112 may be small, which results in a small signal strength at the reader antenna 112. In addition, the sensitivity of the receiver 134 restricts the reading range. Also, the voltage amplitude caused by the generator 124 at the reader antenna 112 is relatively high as compared to the transponder signal, which also makes signal processing more difficult. Furthermore, the noise of the power amplifier within the receiver 134 is more intense than the transponder signal, so that in the event that the signal/noise ratio (SNR) may fall below a minimum, decoding of the transponder signal will no longer be possible. In addition, in such a field of application, the noise created by the person or patient as well as antenna movements caused by a movement of the patient will also interfere with data transmission.

What follows is an explanation of the transfer function for the transponder system shown in FIG. 1, said transfer function being useful to analyze the transmission channel so as to find out, e.g., a signal strength characteristic to be expected as well as further channel characteristics. To derive the transfer function, the equivalent circuit diagram, shown in FIG. 2, of the transponder system shown in FIG. 1 shall be used. The resonator circuit of the transponder 100 is modeled by the voltage source $V_T$, which may be varied by the modulation resistor R. The transmission channel 136 is depicted by an equivalent circuit of a transformer, wherein the resistors $R_R$ and $R_T$ represent transmission losses. The antennas 104 and 112 are represented by the inductances $L_{T-M}$ and $L_{R-M}$, the inductance M modeling the mutual inductance between said antennas. The generator 124 is depicted by its internal resistor $R_G$ and represents the voltage $V_C$.

The transfer function $V_C/V_T$ may be derived by solving Kirchhoffs mesh law, and the result is a first-order bandpass function. When assuming $L_R=409$ nH, $R_R=9.8$ mΩ, C=1.1 nF, and M=0.114 nH, a transfer function as is shown in FIG. 3 will result with a distance of 30 cm.

Switching of the load resistor R results in an amplitude shift keying modulation, so that upper and lower sidebands will occur within the frequency range. The generator signal transmitted from the reader 120 to the transponder 100 acts as a carrier for data transmission in the opposite direction. At 26 kHz a Manchester-coded 13 kbit/s signal has components in the baseband. At the corresponding sideband frequencies, the transmission ratio is about 0.000196. In the event of a modulation voltage of 1 V on the transponder side, about 200 μV are achieved at the reader antenna, effective voltage being limited to about 114 μV.

In a transponder system as is shown by FIG. 1, various noise sources exist as well, the transponder signal being superimposed by noise voltages and noise currents. Such noise sources are located, e.g., in the frequency generator, in the power amplifier, in the antenna, and in the receiver.

The power amplifier also adds a noise caused by the shot noise of the pn junctions and by the so-called Johnson noise of the resistors. This results in that an effective voltage at the receiver is of interest which, with a conventional power amplifier having a noise figure of 16 dB, amounts to about 2.3 mV. The gain of the parallel resonant antenna circuit causes amplification of the noise near the resonant frequency. FIG. 4(a) shows an equivalent noise circuit diagram consisting of a signal source with an amplifier $V_S$ and the noise source $E_S$, the internal resistor $R_S$, the antenna resonant circuit $L_P$ and $C_P$, and the receiver input noise sources $E_N$ and $I_N$. The spectral noise density $V_{SO}$ is composed of the voltage noise density and the current noise density. The noise voltage may be estimated by a simulation, which also yields the system gain as well as the input and noise voltage densities within the frequency range of interest. The resulting noise voltage while using the equivalent noise circuit diagram of FIG. 4(a) is shown by means of FIG. 4(b), when a system having the above-described parameters is taken as the basis.

The mean-square noise voltage may be determined by using a simulation, e.g. a Spice simulation. In addition, the simulation provides the system gain as well as the input and output noise voltage densities within the frequency range of interest. From FIG. 4, a spectral shaping of the white noise is to be detected as input noise, the noise density being at its maximum near the generator frequency of 6.78 MHz. The effective noise voltage is obtained by integrating the noise density over the receiver frequency range. When taking as the basis a bandwidth of 100 kHz, which is useful for a Manchester-coded 13 kbit/s signal, an effective noise voltage of 115 mV results, said value already being many times higher than the transponder signal voltage, which amounts to about 100 μV.

The noise of the antenna is induced only by the real portion of the impedance and may be estimated as follows:

$$E_{ANT}=E_{ANT}\sqrt{(4KTR_{ANT}\Delta f)} \ldots \text{about } 2 \text{ nV}/\sqrt{(Hz)}$$

wherein K=Boltzmann constant, T=absolute temperature and $R_{ANT}$=real portion of the antenna impedance. With a receiver bandwidth of 100 kHz, an effective noise voltage of 630 nV is achieved. Thus, the power amplifier represents the dominant noise source within the system, and in this manner the signal/noise ratio is determined.

In addition to the undesired noise, there is further interference which makes decoding of the transponder signal more difficult, for example a distortion that results from detuning of the reader antenna 112 and that causes a shift, or offset, in the transfer function within the frequency range. This detuning may be caused by a change in the distance between the antennas, as is depicted in FIG. 3 by the various mutual inductances. As may be seen in FIG. 3, a higher mutual inductance results in that the transfer function is shifted toward higher frequencies. However, since demodulation takes place such that it is synchronous with the generator signal, the movement also appears in the baseband, so that the baseband transfer function is no longer a first-order low-pass function. As a result, the transponder signal is distorted, which makes itself felt by a beat of the transponder signal. If the transponder is implanted near the heart, it will move in the rhythm of the heartbeat, and the mutual inductance between the coils will additionally depend on the mutual orientation of the coils. Thus, the attenuation of the voltage across the reader antenna will also vary, which in turn will make itself felt by a beat in the baseband signal.

The signal/noise ratio is a measure describing the quality of the signal. When assuming a conventional load modulation as is used in the transponder system of FIG. 1, the signal/noise ratio may be calculated as follows:

$$SNR=10 \log(V_{eff}/V_{noise})=10 \log(141 \text{ μV})^2/115 \text{ mV})^2=-58.2 \text{ dB}.$$

When using a Manchester-coded signal with 13 kbit/s, a signal/noise ratio of about +10 dB is typically useful for obtaining an acceptable bit error rate (BER). This shows that data transmission is not possible while using conventional load modulation.

In actual fact, conventional load modulation has several disadvantages, which lead to a considerable reduction of the reading range. As was already set forth above, only a very small signal/noise ratio results for data transmission. The sideband signal generated by the load modulation has a spectral distance from the carrier signal that is roughly equal to the data rate. As may be seen from FIG. 4(b), however, the spectral noise power is very high in the vicinity of the carrier signal. The small spectral distance of only a few kH renders filtering impossible. An amplitude variation of the carrier signal, caused by the detuning or by antenna movements, irreversibly superimposes the data signal and renders decoding difficult, if not impossible. In addition, a load modulation wastes energy within the transponder, since during the modulation phase, the modulation resistor is connected to the resonant circuit, and the energy stored within the resonant circuit is transformed into heat during the modulation phase and therefore cannot be reused.

For this reason it is desirable to increase the spectral distance between the reader signal and the data signal; in conventional technology, there are various possibilities of achieving this; however, they do not lead to a useful solution for employing a sensor inside a human body.

A first possible approach is utilization of a so-called sub-carrier as is proposed by the ISO norms 14443 and 10536. A sub-carrier in this context means that the data signal is multiplied, at a constant frequency, by a square-wave signal, for which purpose a frequency of 212 kHz is used, for example. Following the multiplication, both sidebands of the data signal are shifted by a large distance from the carrier signal, specifically in positions where the noise density caused by the power amplifier is lower. However, this technique is disadvantageous since it still employs load modulation, with all of the above-described disadvantages. To eliminate the desired generator signal, the sideband is filtered by a bandpass filter, and the other sideband is not used. Half of the signal energy is thus lost. A further problem is the envelope function of the voltage across the transponder antenna, which limits the possible frequency shift.

FIG. 5 shows the voltage shape over time at a transponder antenna with load modulation while using a sub-carrier. At the time "1", the modulation resistor is connected. Subsequently, the voltage rapidly decreases to "2". The energy within the resonant circuit is transformed into heat. The transponder chip is supplied by the load capacity up to the time "3". At the time "3", the resistor is released and will now obtain energy for increasing the voltage from the reader. This duration depends on the quality factor of the resonant circuit and continues until the time "4" is reached. From this point onward, the diodes of the rectifier within the transponder chip become conductive, and the rise becomes flatter, since the load capacity of the transponder chip is recharged. The time "5" is the first time for starting the next modulation process. Thereby, the maximum sub-carrier frequency is limited, and simulations have shown that, for this application, a sub-carrier frequency of 70 kHz would be ideal—however with an achievable signal/noise ratio at −20 dB, which is still too low.

A further approach to increasing the spectral distance between the reader signal and the data signal consists in providing magnetically disconnected antennas, FIG. 6 showing a fundamental antenna arrangement for such an implementation. It may be seen in FIG. 6 that the reader antenna 122 comprises a first antenna 122a and a second antenna 122b arranged orthogonally to the first antenna 122a. Likewise, the transponder antenna 110 comprises a first antenna 110a and a second antenna 110b arranged orthogonally to the first antenna 110a. The first antenna 122a of the reader 120 serves to transmit energy to the transponder 100, wherein the energy is received by the first antenna 110a. Within the transponder 100, the antenna 110b arranged orthogonally to the antenna 110 is provided for a data transmission, and within the reader 120, the antenna 122b receives the data. The corresponding field configurations for the energy transmission and the data transmission are also shown in FIG. 6, data transmission being depicted by the continuous line, and energy transmission by the dotted line. Thus, within the reader and within the transponder, the antennas 112b and 110b that may be used for data transmission are arranged orthogonally to the power transmission antennas 122a and 110a, so that data transmission will not be influenced by any undesired coupling of the energy transmission from the reader, including noise. However, this approach has several disadvantages, so that it is not suited for being applied in medical sensor transponders. Firstly, there is not sufficient room for a second antenna within a transponder that is to be implanted by means of a catheter. A second problem is the fact that a useful fixed orientation of the antennas for the implanted transponder is not always guaranteed, and that said implanted transponder also has a very poor energy balance. Additional power may be used for generating a transmission signal using the second antenna. For this purpose, only the power received from the reader by means of the first antenna is available, but losses will occur within the rectifier and the amplifier which drives the second antenna. The efficiency of the rectifier depends on the threshold voltages of the diodes used and on the parasitic capacitances, so that even when using a highly efficient amplifier for driving the second antenna, such as a class C amplifier, 20% of the power will still be lost.

In addition to the above-described methods, there is also the so-called sequential method, which is a kind of time multiplexing. During a first period of time, the power is transmitted from the reader 120 to the transponder 100, where the power is stored within a load capacitor. During a second period of time, the reader 120 switches off the field, and data transmission from the transponder 100 to the reader is performed. The transponder uses the stored energy for generating transmission of the signal, the same antennas being used for transmitting the energy and for transmitting the data. The advantage of this method is that, during data transmission, there will be no disturbing carrier signal from the reader, so that considerably higher signal/noise ratios may be achieved. However, a disadvantage is the requirement of providing a load capacitor having sufficient capacity which more clearly exceeds the dimensions admissible for an implantable transponder. As in the method using orthogonal antennas, losses will also occur within the rectifier and the amplifier, so that power will be lost. In addition, data transmission consumes more time since it has to be interrupted periodically to transmit energy. For continuous pressure data transmission, higher data rates and a buffer within the transponder would thus be useful, so that this method, too, cannot be employed for the above-mentioned applications.

In summary, one may therefore state that the approaches—described in detail above and known from conventional technology—of using passive transponders are not sufficient for supplying a sensor transponder having a limited antenna size with sufficient energy while ensuring safe data transmission, in particular in environments wherein the transponder is surrounded by attenuating material, such as when being used inside a human body.

SUMMARY

According to an embodiment, a passive transponder for an RFID system may have: an antenna; an antenna oscillator circuit; and a data source; the antenna oscillator circuit being configured to operate at a first resonant frequency or at a second resonant frequency, depending on a reception of energy at the transponder or on a data transmission from/to the data source.

According to another embodiment, a transponder system may have: a passive transponder for an RFID system, including: an antenna; an antenna oscillator circuit; and a data source; wherein the antenna oscillator circuit is configured to operate at a first resonant frequency or at a second resonant frequency, depending on a reception of energy at the transponder or on a data transmission from/to the data source; and a reader configured to excite the passive transponder at the first resonant frequency and to receive a transmit signal from the passive transponder at the second resonant frequency.

According to another embodiment, a method of transmitting data from/to a data source of a passive transponder within an RFID system may have the steps of: exciting the passive transponder at a first resonant frequency of an antenna oscillator circuit of the passive transponder; and in the event of a data transmission, switching the first resonant frequency of the antenna oscillator circuit of the passive transponder to a second resonant frequency so as to transmit a data signal at the second resonant frequency.

Advantageously, switching between the resonant frequencies occurs once the energy transmitted to the transponder has reached a predetermined level. The antenna oscillator circuit comprises, in accordance with embodiments, a capacitive assembly and an inductive assembly, said switching between the resonant frequencies being caused by changing the capacitance value of the capacitive assembly and/or of the inductance value of the inductive assembly. In accordance with further embodiments, the passive transponder comprises a controller for causing a change in the corresponding values of the capacitive assembly or inductive assembly, this advantageously taking place when a predetermined portion of the energy stored within the antenna oscillator circuit is stored within the inductive or within the capacitive assembly.

Advantageously, the capacitive assembly comprises a plurality of capacitive devices that may be selectively switched on or off, or a variable capacitive device, so that by adding or removing the capacitive devices, or by changing the capacitance of a capacitive device, switching between the resonant frequencies may be effected. The inductive assembly is advantageously defined by the inductance of the antenna, the capacitance values of the capacitive assembly being switched when a predetermined portion, e.g. a maximum portion, of the energy stored within the oscillator circuit is stored within the antenna.

In accordance with the invention, thus, an approach is provided that differs from conventional load modulation as is employed in conventional RFID systems; instead, a new data transmission technique, also referred to as frequency shift keying, is introduced which enables data transmission over a relatively large distance, for example within a sender transponder implanted deeply into a human body. According to the invention, it is taught to generate a data transmission signal having a freely selectable carrier frequency of its own, so that this signal is no longer influenced by the envelope function of the transponder resonant circuit. To this end, a frequency is advantageously selected at which the spectral noise density of the power amplifier is low. Advantageously, the frequency is selected such that there will be a large spectral distance between the carrier and the data signal, so that one may readily use a filter for suppressing the undesired carrier. A particular advantage of the subject matter of the present invention is that no additional energy may be used for generating the transmission signal.

In contrast to conventional methods as were described above, in particular in contrast to load modulation, the present invention uses the energy stored within the resonant circuit for transmitting a data signal at a different frequency, which is achieved in that the resonant frequency of the antenna oscillator circuit is altered, advantageously erratically. Switching of the resonant frequency may be achieved either by switching a capacitance or by using a capacitance diode or an adjustable inductance.

BRIEF DESCRIPTION OF THE DRAWINGS

Embodiments of the present invention will be detailed subsequently referring to the appended drawings, in which.

DETAILED DESCRIPTION OF THE INVENTION

Figure 1:
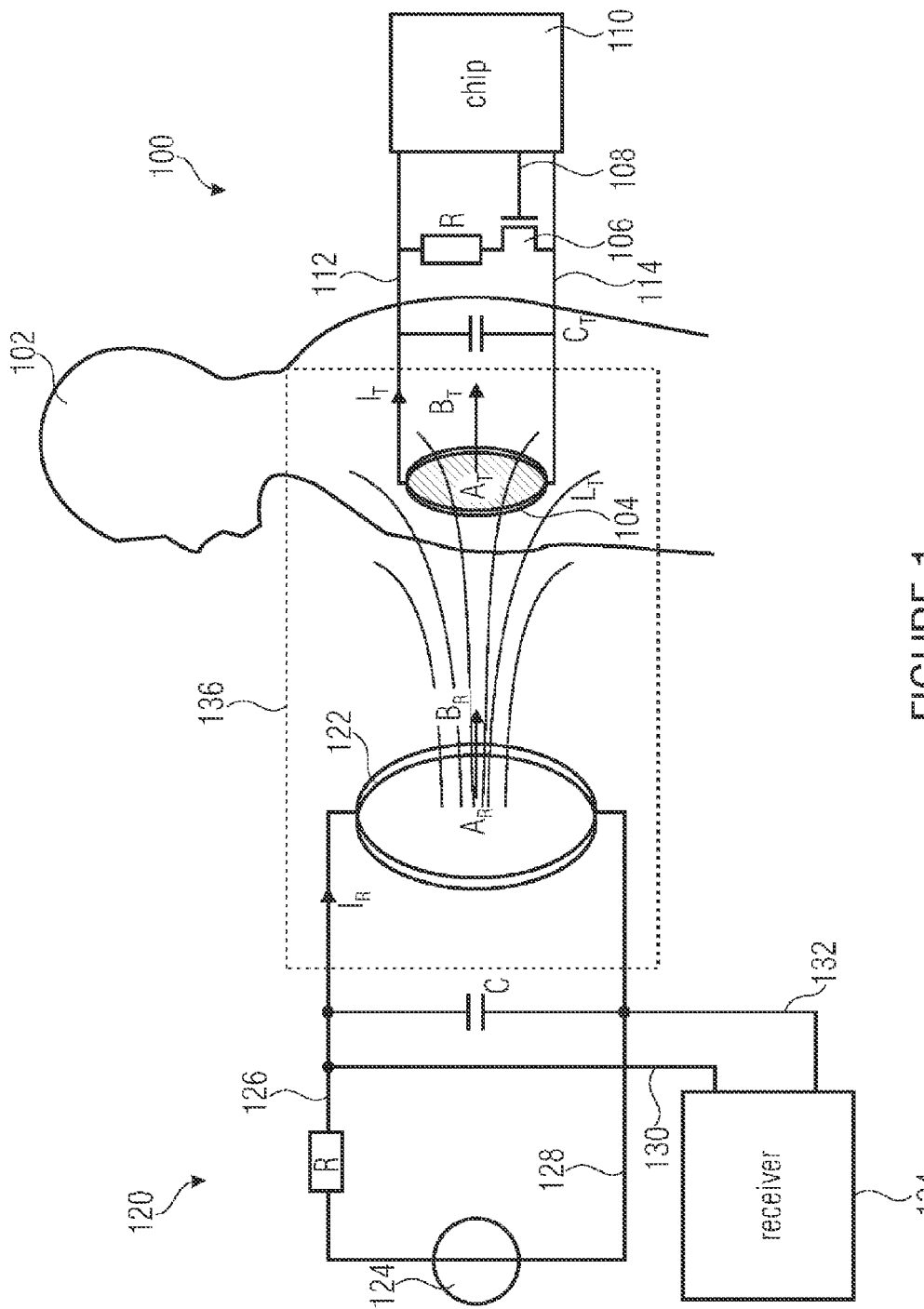
FIG. 1 shows a schematic representation of a known transponder system comprising a passive transponder, implanted into the body of a patient, for providing measurement signals.
Figure 2:
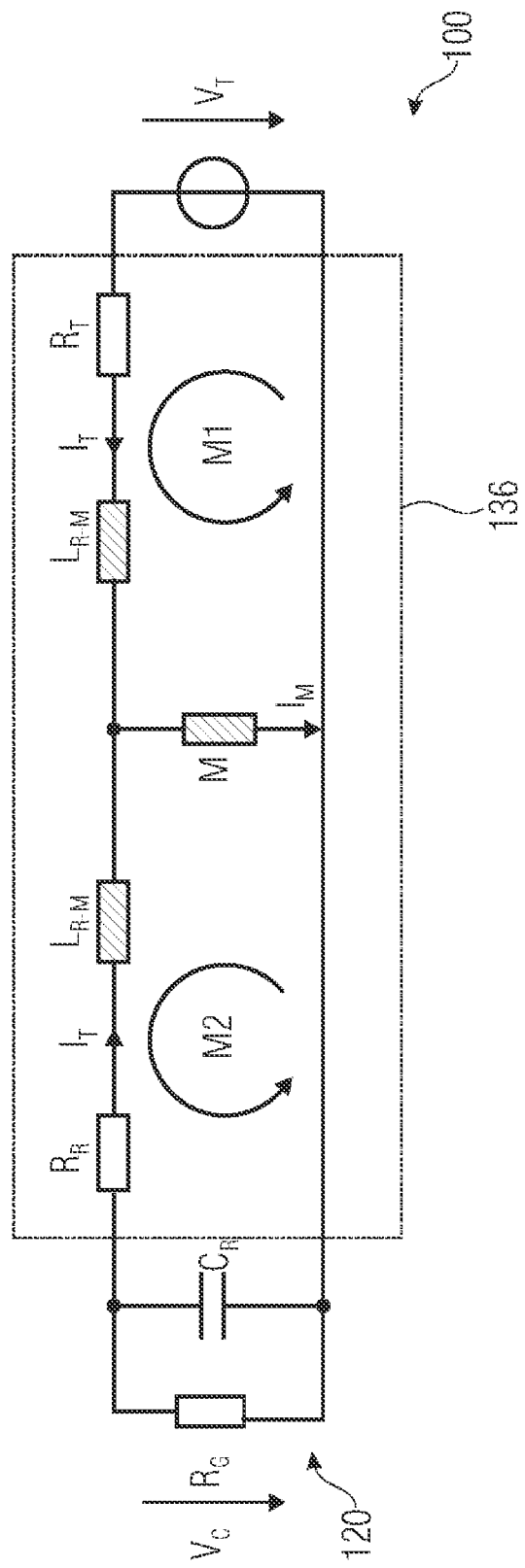
FIG. 2 shows an equivalent circuit diagram of a transponder system shown in FIG. 1.
Figure 3:
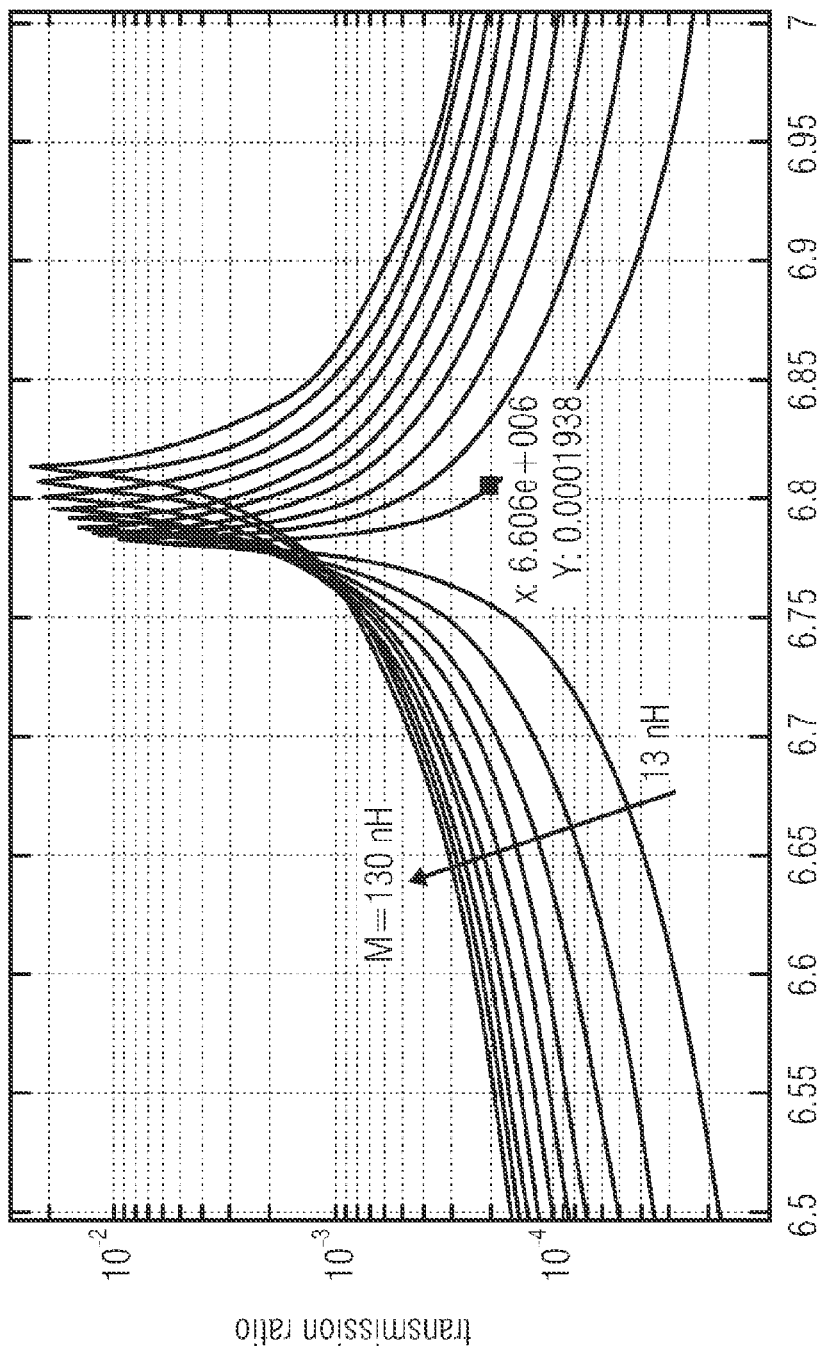
FIG. 3 shows a graph of the transfer function of the transponder system shown in FIG. 1 with changing distances between the reader and the passive transponder.
Figure 4A:
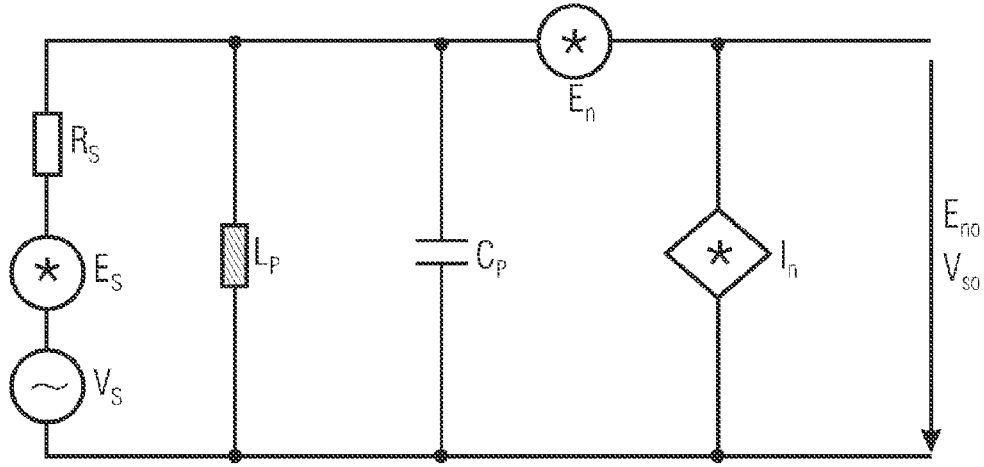
FIG. 4(a) shows the equivalent noise circuit diagram of the transponder system of FIG. 1.
Figure 4B:
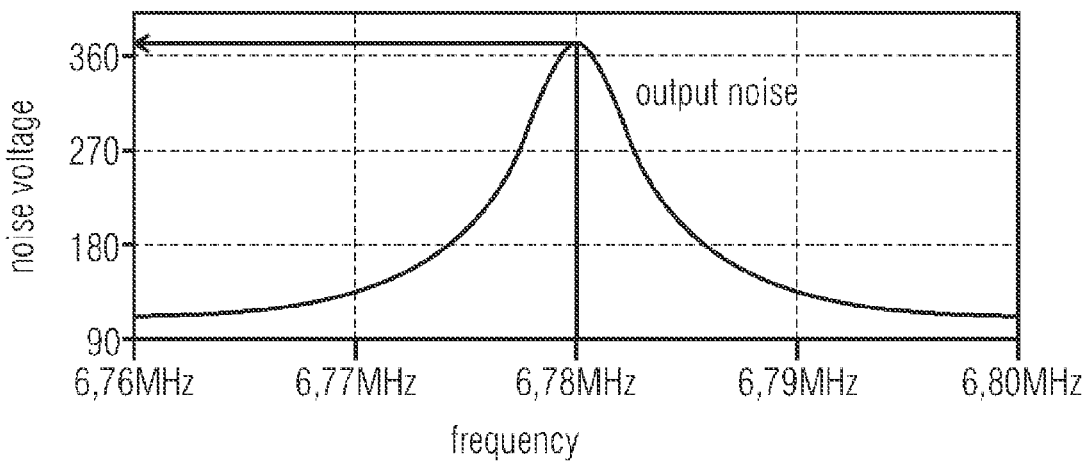
FIG. 4(b) shows a graph representing the noise voltage over the frequency of the reader of the transponder system of FIG. 1.
Figure 5:
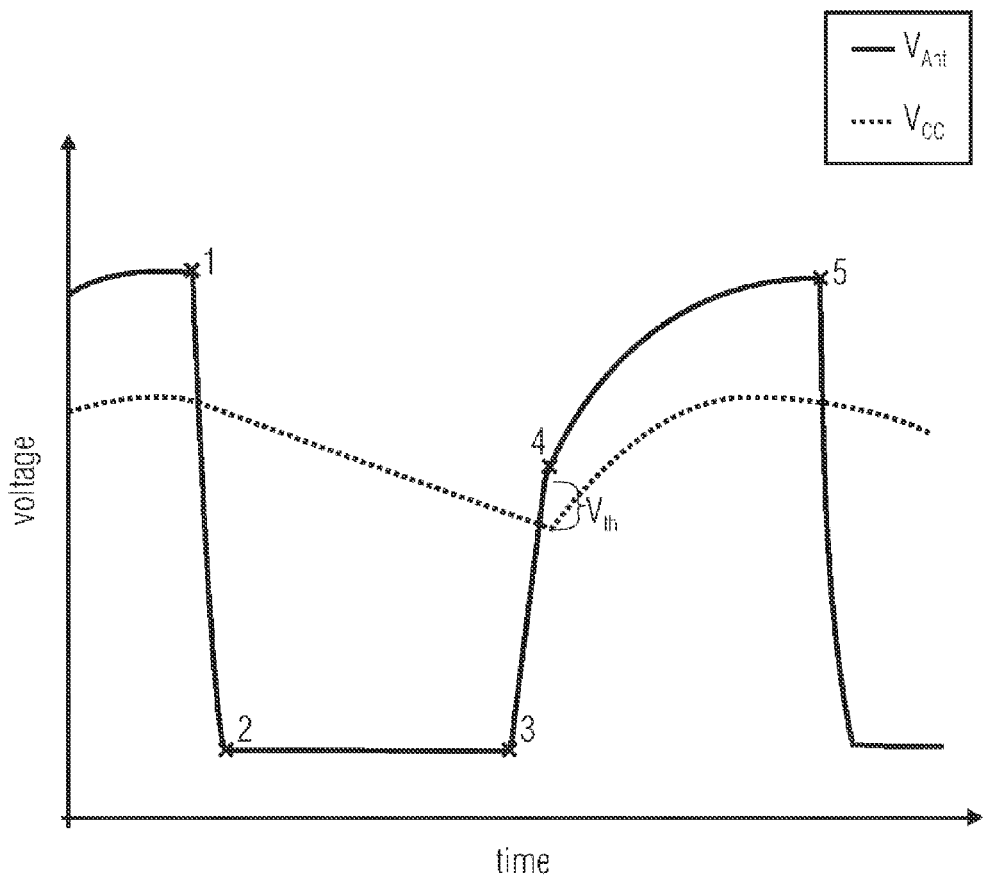
FIG. 5 shows the voltage shape over time at a transponder antenna with load modulation within a transponder system which uses a sub-carrier.
Figure 6:
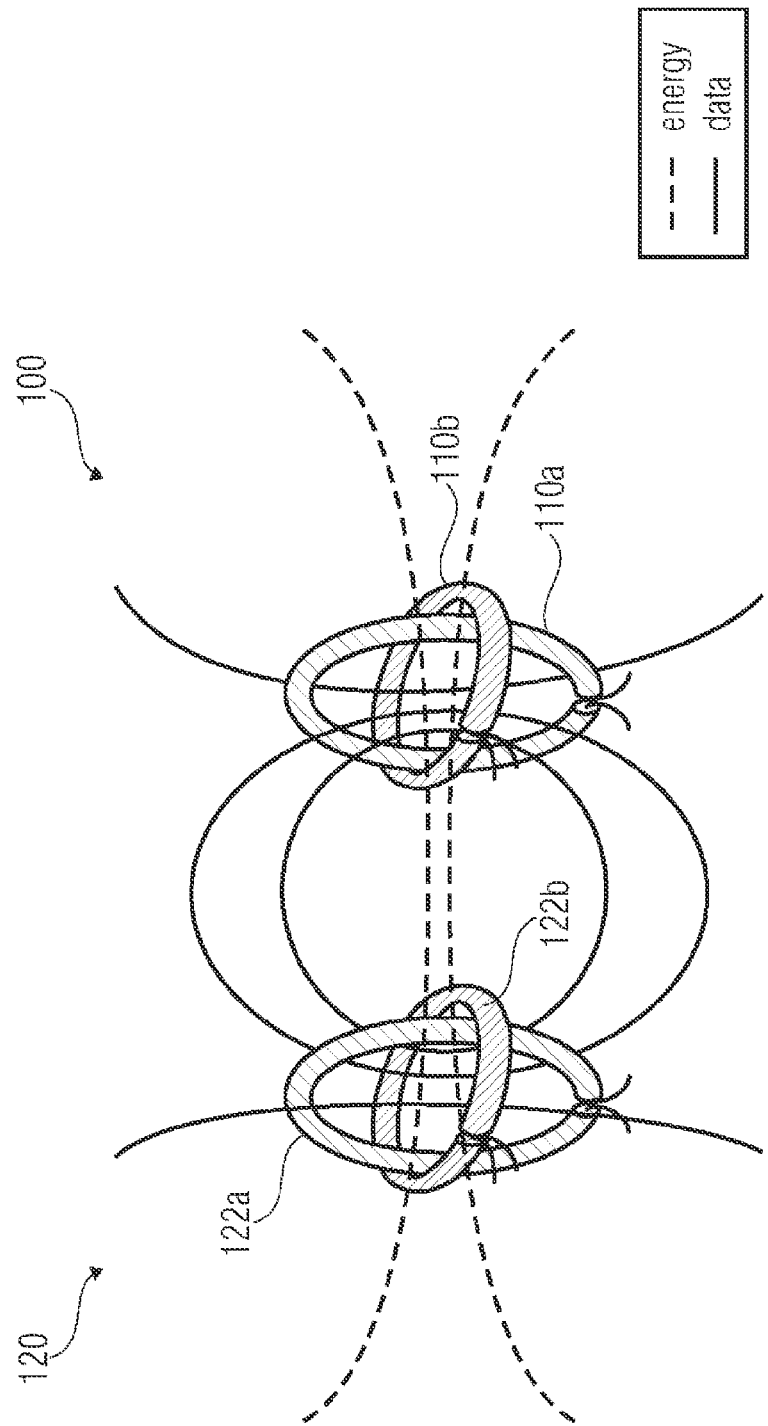
FIG. 6 shows an orthogonal antenna arrangement in accordance with a further, known transponder system.

Embodiments of the present invention will be explained in more detail below; elements that are identical or identical in function have been given the same reference numerals in the drawings.

Figure 7:
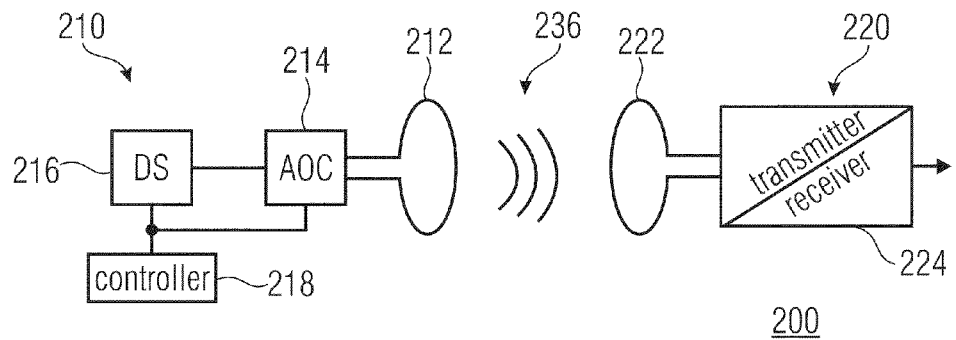
FIG. 7 is a schematic representation of a transponder system with a passive transponder in accordance with an embodiment of the invention.

FIG. 7 shows a schematic representation of a transponder system designated by reference numeral 200 in its entirety. The transponder system 200 comprises a passive transponder 210 which has a transponder antenna 212 that is connected to an antenna oscillator circuit 214. The transponder 210 further comprises a data source 216 and a controller 218. The transponder system 200 further comprises a reader 220 which comprises a read antenna 222 connected to a transmitter/receiver 224. In accordance with the present invention, a technique shall be applied which will be referred to below as frequency shift keying, as was mentioned above. Whereas in conventional technology, in the load modulation technique, the energy stored in the resonator circuit 214 of the transponder is converted into heat by the modulation resistor during the modulation phase, the inventive frequency shift keying approach follows a different approach and uses this energy, which is wasted in conventional technology, for generating a transmission signal at a separate frequency. Via the antenna 222, the sensor transponder system 200 shown in FIG. 7 generates a field, for example at a frequency of 13.56 MHz or 6.78 MHz, which serves to transmit energy to the transponder 210. This energy is stored within the resonant circuit, or within the antenna oscillator circuit, 214 of the transponder 210 for such time until the voltage amplitude across the resonant circuit reaches a predetermined value, for example a maximum. From this point in time, no more active power may be used, and only a small portion of the overall power stored within the antenna oscillator circuit may be used for supplying the transponder circuits, such as the data source 216 or a corresponding chip as was described by means of FIG. 1. If the process described in the following takes place before the maximum voltage amplitude is reached, the transponder electronics 216 does not have the maximum operating voltage available to it. The energy stored with the resonant circuit oscillates between an antenna inductance and a capacitive assembly, a capacitance within the resonant circuit 214 being changed advantageously at a moment when the energy is fully in the antenna inductance. Alternatively, an inductive device may be provided that is changed, for example, when the energy is fully in the capacitance. For the event that the change in capacitance, or, alternatively, in inductance, is effected by adding or removing a second capacitance, or, alternatively, a second inductance, and, in addition, is effected at a different point in time than the one described above, the energy remaining in the capacitance, or, alternatively, inductance, will not be used for emitting a signal. The reason for this is that, in this case, part of the electric charge, or of the magnetic energy, is removed from the oscillator circuit. However, the energy is not lost since it is re-supplied to the oscillator circuit once the second capacitance or inductance has been added. This will then reduce the settling time of the oscillator circuit to the first frequency. In addition, it would also be feasible to deliberately defer the switching time so as to control the ratio of energy that has been emitted and remaining energy.

Due to the change in the resonant frequency of the antenna oscillator circuit, the energy stored within same now is at a different frequency, and a field having a correspondingly separate frequency is generated, which takes place for such time until the energy has decreased to a predetermined value, e.g. 60% or 20%, due to losses inside the antenna 212 of the transponder 210. Subsequently, the frequency is re-adjusted to have the original value so as to enable repeated charging of the energy within the resonant circuit, or oscillator circuit, 214 by the reader.

The frequency of the signal generated by the transponder during the modulation depends on the extent to which the resonant frequency of the antenna oscillator circuit 214 is changed, but not on the repetition rate of the change process or switching process. As a result, the change may be selected such that frequencies are obtained at which good filters are readily available, the repetition rate for the switching operation being adapted to the requirements placed upon the data rate and the energy consumption within the transponder, so that sufficient, continuous supply of the transponder elements is ensured. For example, a frequency of the signal generated during the modulation might be selected to be 10.7 MHz, since in the market, corresponding ceramic filters might be utilized within a reader. In addition, it might be useful to select a frequency of the ISM bands, such as 13.56 MHz or 27 MHz. The repetition rate might be 50 kHz, for example. With an oscillator circuit having a time constant of 2.76 µs, this would result in an interruption of the energy supply for 50% of the time.

The generated data signal may be received at the reader 220, for example, by an antenna 222 configured as a gradient antenna, or by a separate antenna tuned to the corresponding frequency.

It shall be noted at this point that the functionality is such that the reader 230 continuously transmits the excitation energy during the readout operation, specifically at a first resonant frequency, so that the antennas of the reader and of the transponder are tuned to each other, and that the resonant circuit within the transponder 210 absorbs the corresponding energy up to the useful level. As soon as said level is reached, a resonant frequency of the antenna oscillator circuit is changed, as was mentioned above, so that the antenna which is part of this antenna oscillator circuit is detuned relative to the transmit antenna 222 and therefore allows generation of only little or no energy due to the magnetic field generated by the reader antenna 222, and instead transmits at the second frequency, separate from the reader signal sequence. This approach is advantageous, in particular, in that no "reverse channel" may be used between the transponder and the reader, since following the modulation phase, one automatically goes back to the first frequency, so that the antenna 212 and the transponder 214 are then tuned to the reader antenna 222 again, and that, thus, renewed recharging of the energy level within the transponder 210 is ensured.

Figure 8:
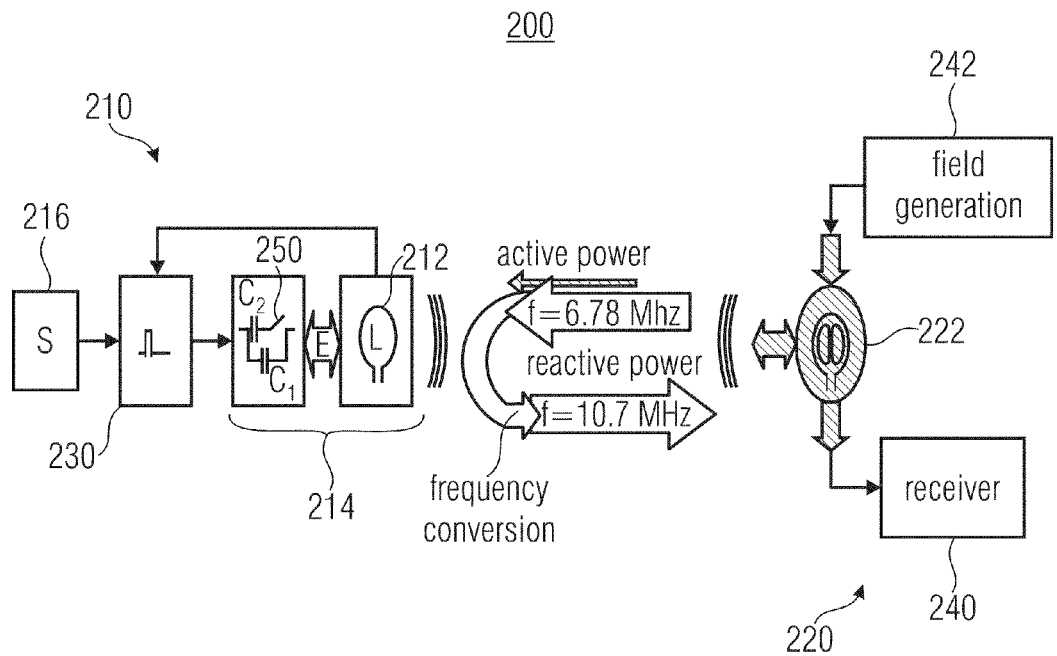
FIG. 8 is a schematic representation of a transponder system with a passive transponder in accordance with a further embodiment of the invention.

FIG. 8 shows a schematic representation of a transponder system having a passive transponder in accordance with a further embodiment of the invention, in FIG. 8 the transponder 210 comprising the antenna 212, the antenna oscillator circuit 214 formed by the shown capacitances and by the inductance L of the antenna 212, and the data source 216. The controller shown in FIG. 7 is not shown in FIG. 8 for simplicity's sake, but exists. In addition, the transponder 210 comprises a coding block 230 that will be described later on. The reader 220 comprises the transmit/receive antenna 222 as well as a receiver 240 and a field generation unit 242, each of which is coupled to the transmit/receive antenna 220. As is schematically shown in FIG. 8, the field generation unit 242 causes the transmit/receive antenna 222 of the reader 220 to be controlled such that active power is transmitted at a frequency of 6.78 MHz in the direction of the transponder 210. Due to the inventive frequency shift keying, the data is re-transmitted in the above manner at a frequency of 10.7 MHz. In the embodiment shown in FIG. 8, the resonant circuit/the antenna oscillator circuit 214 of the transponder 210 comprises the inductive component L of the antenna 212 as well as a parallel connection consisting of two capacitors $C_1$ and $C_2$, a switching element 250 being provided which is connected in series with the capacitor $C_2$ and may be selectively actuated, for example by a control signal from the controller 218, as to disconnect the capacitor $C_2$ from the oscillator circuit, or to connect it to the oscillator circuit. The reader transmits at a frequency of 6.78 MHz, and initially, the switch 250 is closed, so that the energy absorbed oscillates, within the resonant circuit, between the antenna inductance L and the capacitance $C_1$ and $C_2$. If the energy is fully in the antenna inductance L, the capacitance will be removed from the resonant circuit by switching off the capacitor $C_2$, i.e. by opening the switch 215, and thus, the resonant frequency is changed. Now the energy oscillates at a different frequency, and a field having a correspondingly different frequency is generated. As soon as the energy stored within the oscillator circuit has fallen below a prescribed level, the capacitor $C_2$ is added again, and energy is built up again. In the embodiment shown in FIG. 8, a frequency change to a transmit frequency of 10.7 MHz is created due to the change in capacitance, the switching frequency at which the switching element 250 is actuated being 50 kHz, depending on the requirements regarding the data rate and the energy consumption of the transponder.

Figure 9A:
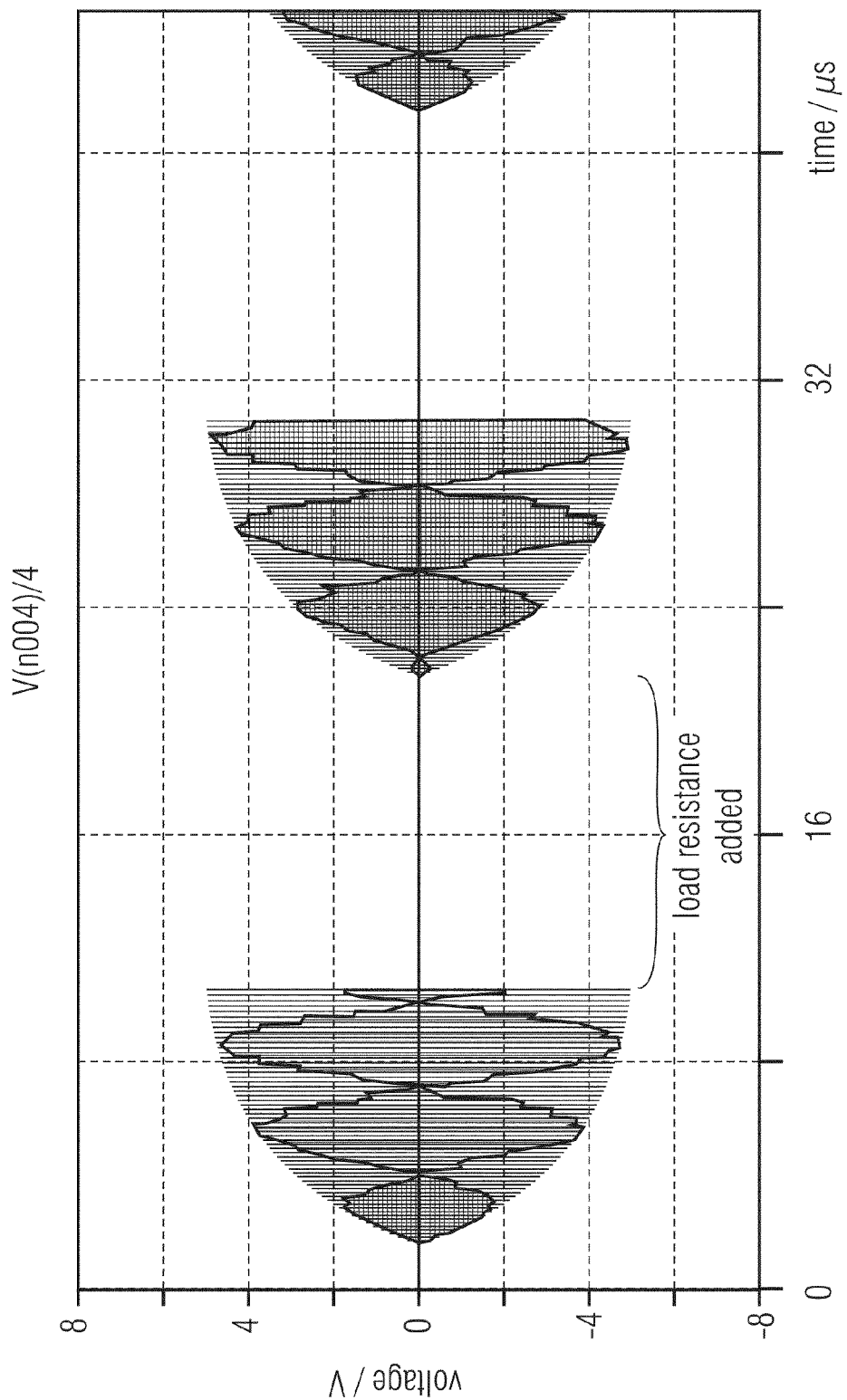
FIG. 9 shows a graph which represents the voltage shape within an antenna oscillator circuit of a transponder system in accordance with FIG. 1 with load modulation in the time domain (FIG. 9(a)) and in the frequency domain (FIG. 9(b))
Figure 9B:
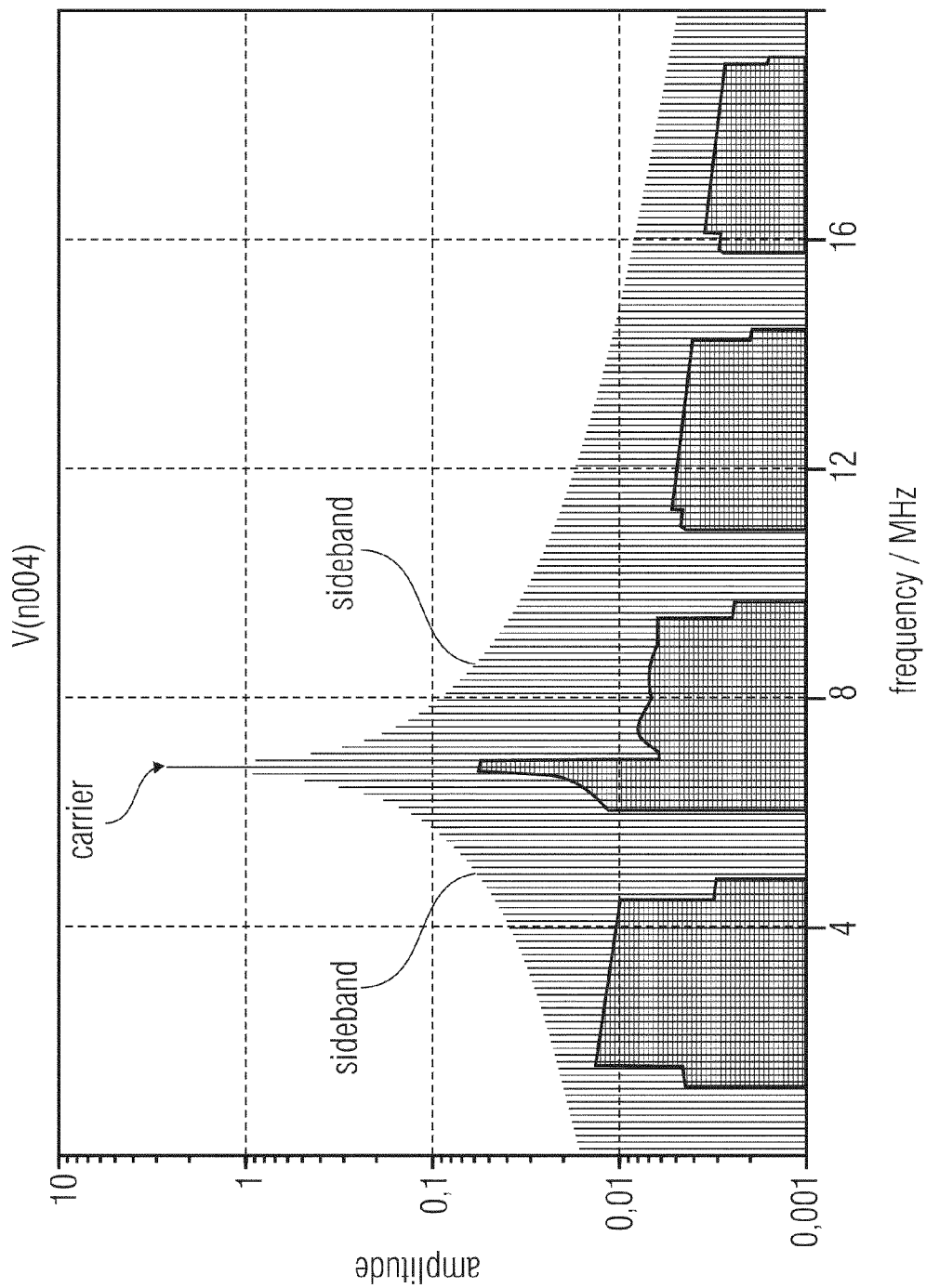

The effectiveness of the inventive approach will be explained below by a comparison with the load modulation technique. Based on a simulation, the results of utilizing a transponder with load modulation and a transponder with frequency shift keying were verified under identical conditions. FIG. 9 shows graphs that depict the voltage shape within the antenna oscillator circuit of a transponder system of FIG. 1 with a load modulation in the time domain and/or the frequency domain. During load modulation, an envelope forms which generates sidebands within the spectrum that, in terms of mirror symmetry, lie above and below the carrier frequency provided by the reader. FIG. 9b shows an FFT of this signal. In practice, due to their low amplitudes, the sidebands at the receiver (reader) are below the noise level that is also symmetrical to the carrier frequency.

Figure 10:
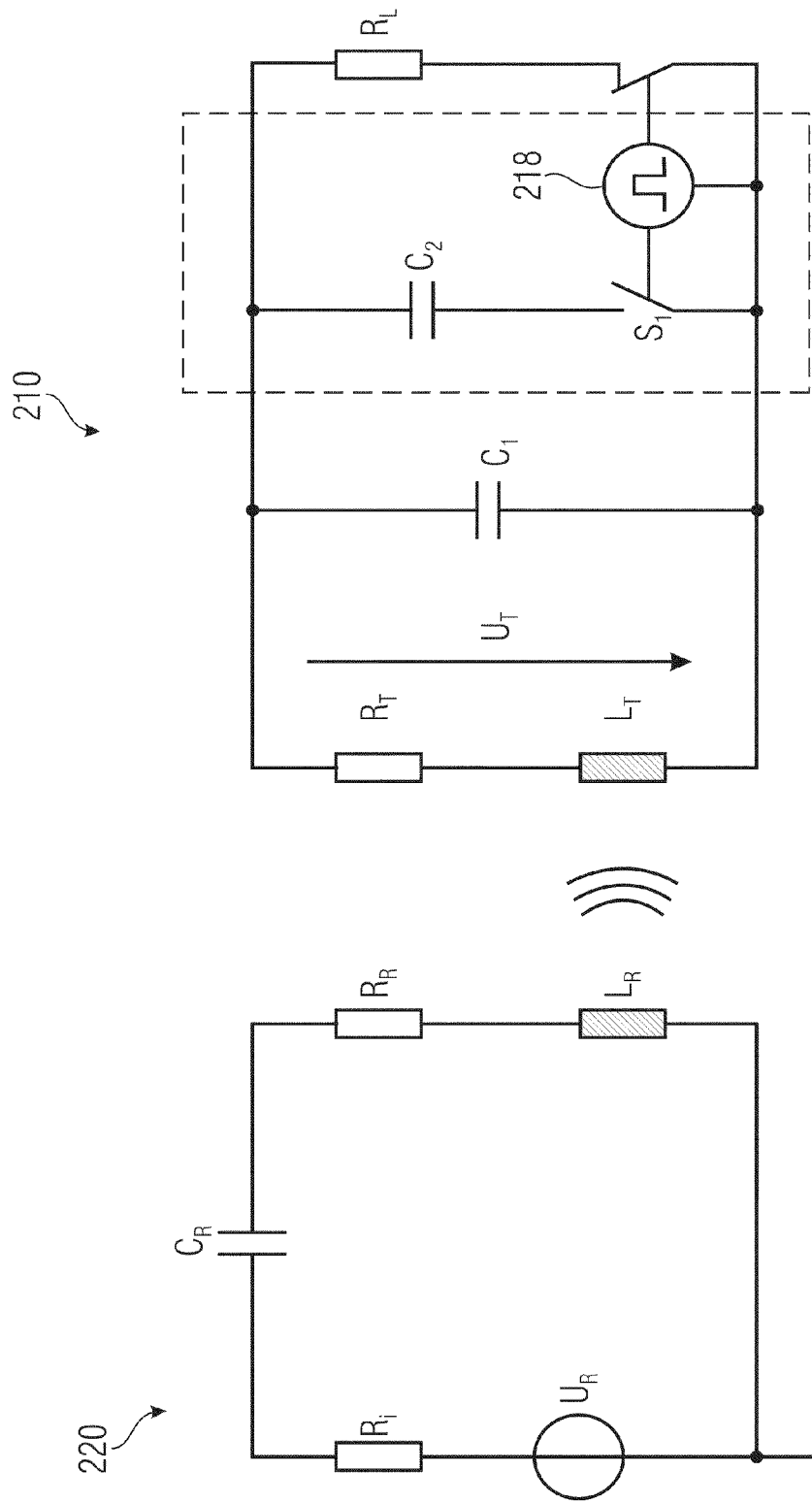
FIG. 10 shows an equivalent circuit diagram of the transponder system of FIG. 8.

To test the mode of operation of a passive transponder in accordance with the present invention as was described by means of FIG. 8, a simulation was performed on the basis of the circuit depicted in FIG. 10 by an equivalent circuit diagram. The transponder 210 comprises a parallel connection consisting of the antenna inductance $L_T$, the capacitor $C_1$, the series connection consisting of the capacitor $C_2$ and the switching element $S_1$, which is controlled by the controller 218, and the load $R_L$ which, during frequency shift keying, is removed, or disconnected, from the circuit, as is the capacitor $C_2$. The resistor $R_T$ reflects the ohmic losses of the antenna coil.

The reader 220 is depicted by the antenna coil $L_R$ and the associated ohmic losses $R_R$, $U_R$ representing the signal generator for generating the field, said signal generator being coupled to the coil via a capacitor $C_R$. The resistor $R_i$ indicates the internal resistance of the generator.

Figure 11A:
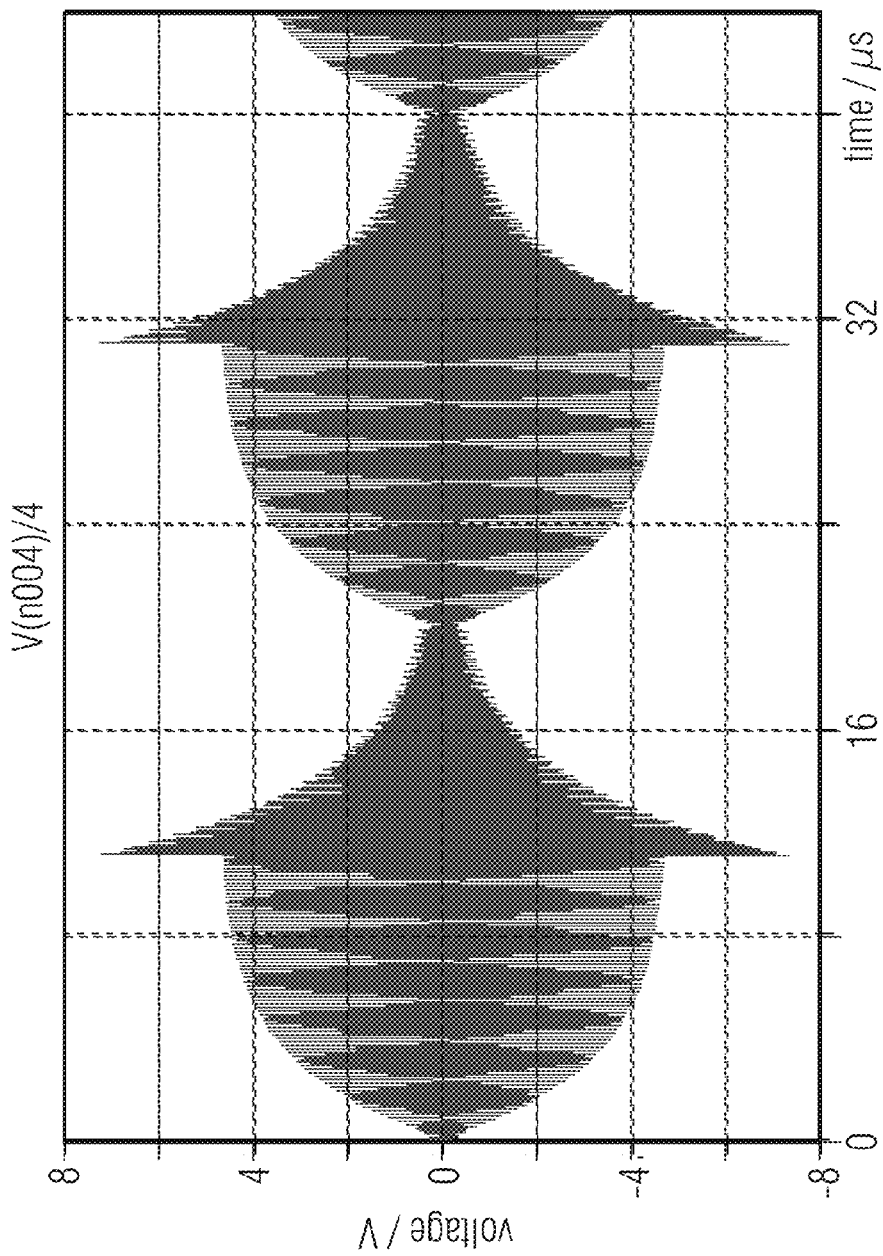
FIG. 11 shows a graph which depicts the voltage shape within the antenna oscillator circuit of the passive transponder in accordance with FIG. 8 in the time domain (FIG. 11(a)) and in the frequency domain (FIG. 11(b))

With the aid of the source $U_R$ and of the antenna coil $L_R$, a magnetic field having a frequency of 6.78 MHz is generated. The switch $S_1$ disconnects the capacitor $C_2$. If the switch $S_1$ is closed, the frequency will be 6.78 MHz, otherwise the resonant frequency of the antenna oscillator circuit will be 10.7 MHz. The resulting signal across the antenna oscillator circuit is depicted in the time and frequency domains in FIG. 11. The switching operation may be easily seen in FIG. 11(a). Initially, the voltage amplitude rises at a frequency of 6.78 MHz. Once the switch $S_1$ has been opened, the resonant circuit oscillates at a frequency of 10.7 MHz, whereby a signal is generated which has a carrier frequency of its own of 10.7 MHz and has an exponentially decaying envelope. This further signal may be easily detected at the frequency of 10.7 MHz in the corresponding spectrum in FIG. 10(b), the switching rate being 50 kHz in the example shown.

Figure 11B:
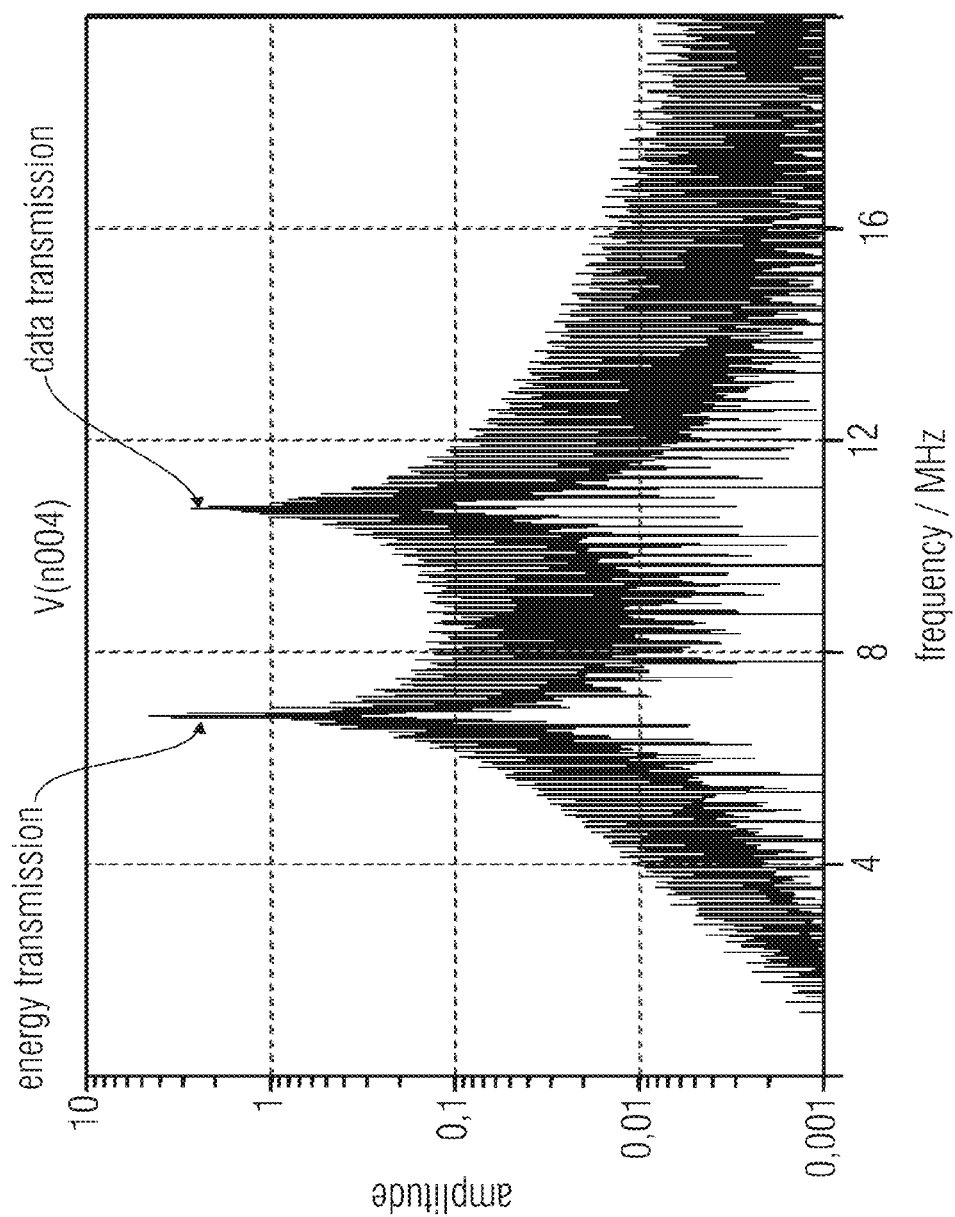

A comparison of FIGS. 10 and 11 reveals that, in accordance with the invention, a data transmission signal is generated in a simple manner at a frequency that is sufficiently far apart from the carrier frequency of the reader.

Figure 12A:
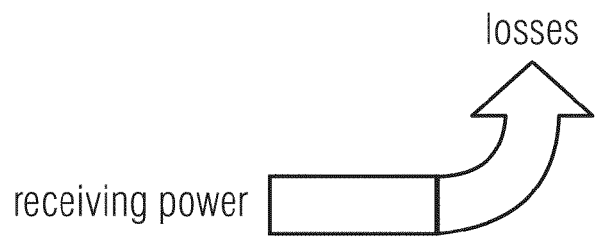
FIG. 12 is a representation of the losses within a transponder system comprising a conventional transponder (FIG. 12(a)) and a transponder in accordance with an embodiment of the invention (FIG. 12(b))
Figure 12B:
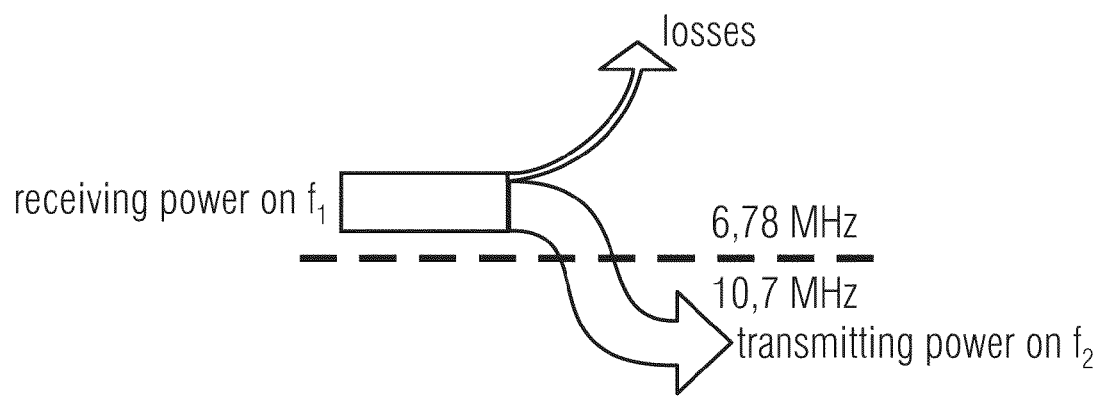

From energetic points of view, two factors are of interest, namely the efficiency of a transmission signal generation, and a negative influence of same on the energy supply of the transponder chip and/or the data source. In frequency shift keying, the received energy is directly used within the antenna oscillator circuit for generating a transmission signal so that no energy is lost in rectifiers, amplifiers or in an energy storage, as has been the case conventionally. As a result, the inventive approach operates in a very efficient manner, as may be seen from a comparison of FIGS. 12(a) and 12(b). FIG. 12(a) shows the representation of the losses in a conventional transponder system which uses load modulation. As was set forth above, the entire energy here is lost due to thermal losses during modulation. This is different in the subject matter of the present application, wherein only a small portion of the energy is lost, and the main portion is used for generating the transmit signal at the second frequency.

In the load modulation technique, one typically employs Manchester coding of the data signal, which results in that the data signal will typically have a mean of 0.5. In the load modulation technique, the transponder cannot absorb any energy from the reader field during the modulation phase. It is to be deduced that energy transmission from the reader to the transponder is interrupted during one half of the time. This value is independent of the data rate.

In contrast to this, the inventive frequency shift keying method is advantageous since the exponentially decaying pulse explained above has a fixed length, so that the repetition rate may be selected depending on the coding method, the data rate, and the desired signal/noise ratio. In the following, possible coding will be introduced, which may be employed in accordance with the invention, along with an estimation of the signal/noise ratio to be expected.

For adapting the data stream to the transmission channel 236, one employs a coding by means of which the symbols representing the information bits are defined. Each symbol is to have a shape which enables simple decoding within the reader, for which purpose a matched filter having a decision maker with a maximum probability for decoding the signal within the receiver is typically employed. The so-called bit error rate (BER) defines the ratio between bits for which the coding has failed and the total of bits transmitted. The BER is directly dependent on the signal/noise ratio, and there will be fewer decision errors for higher signal/noise ratios. The signal/noise ratio is defined as the effective voltage of the signal versus the effective voltage of the noise, so that the signal/noise ratio increases when several exponentially decaying pulses as are shown in FIG. 11 are used for representing a symbol. For example, if a data rate of 13 kbit/s may be used, and if the switching rate is 50 kHz, the symbol length will be 4 switching periods, whereby the signal/noise ratio may be maximized. This will be explained in more detail below with reference to FIGS. 13 to 15.

Figure 13:
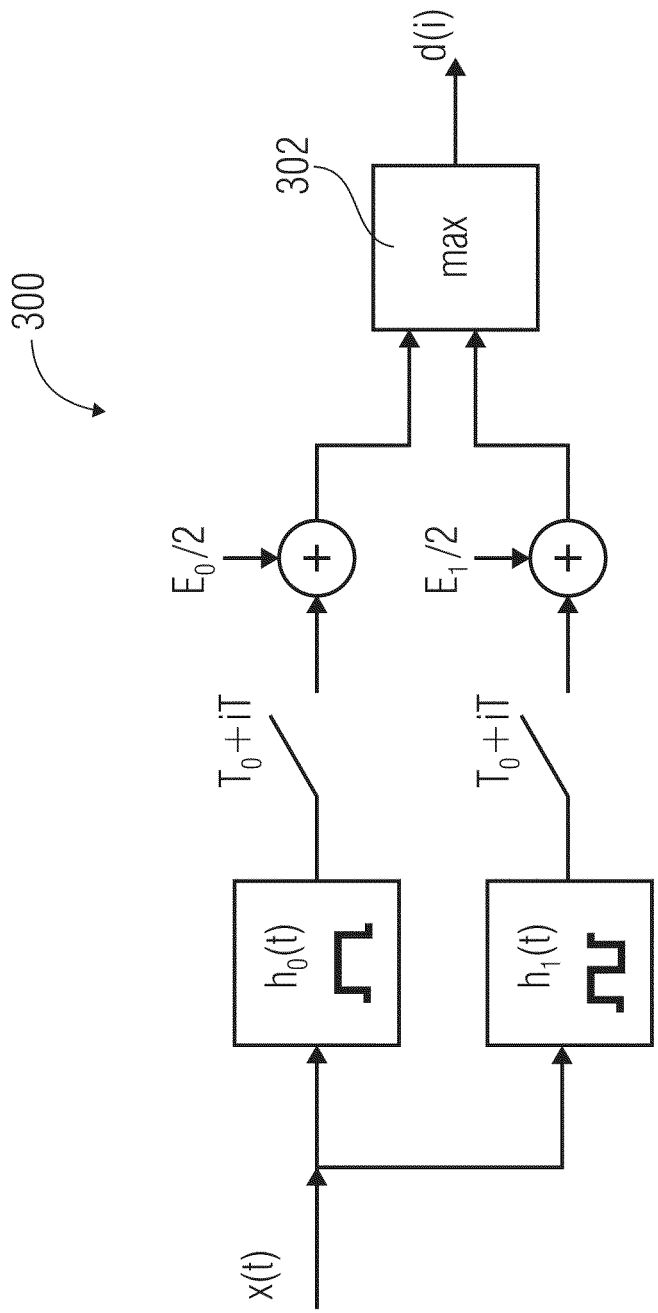
FIG. 13 is a schematic representation of a matched-filter receiver.

FIG. 13 shows a so-called matched-filter receiver 300 in the form of a schematic representation. The matched-filter receiver 300 consists of two matched filters $H_0$ and $H_1$, each of which contains the pulse response of the two possible symbols "0" and "1". For safely recognizing the symbols contained within the data signal x(t), it is useful for the output signal of the two filters $H_0$ and $H_1$ to have a maximum difference with regard to a prescribed point in time $T_0$. The receiver 300 further comprises a decision maker 302, which makes a decision concerning the received signal on the basis of the output signals of the filters. For all of the possible symbols, there is a matched filter, as is shown in FIG. 13, namely a filter for a logical "1" and for a logical "0". The output signal of the matched filters indicates the similarity of the received symbol with a "1" and/or "0". Following a symbol period, the output signals are sampled and compared by the decision maker 302. Then the larger output value will be detected. This is performed for any symbols received, whereby the data signal is decoded. If the received data signal x(t) is noisy, the output signals of the filters will also be noisy, so that it may happen that the wrong filter provides the higher output signal. In this case, the decision maker makes a mistake. The number of misdecisions as seen from a statistical point of view depends, in addition to the signal/noise ratio, on the so-called Euclid distance, which describes the similarity between the symbols "1" and "0". A larger Euclid distance thus leads to a larger difference in the sampled output values of the filters, so that a smaller number of wrong decisions arises. FIGS. 14 and 15 show two examples of what symbols having a length of 4 switching periods and a maximum Euclid distance may look like.

Figure 14A:
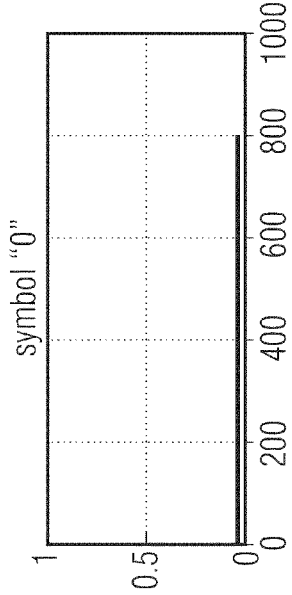
FIGS. 14(a)-(d) are representations of the symbols "1" and "0" having a length of 4 switching periods.
Figure 14C:
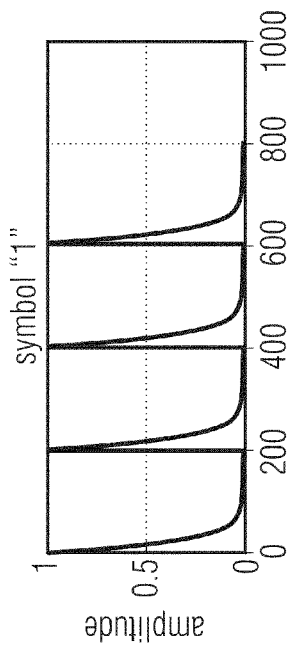
Figure 14B:
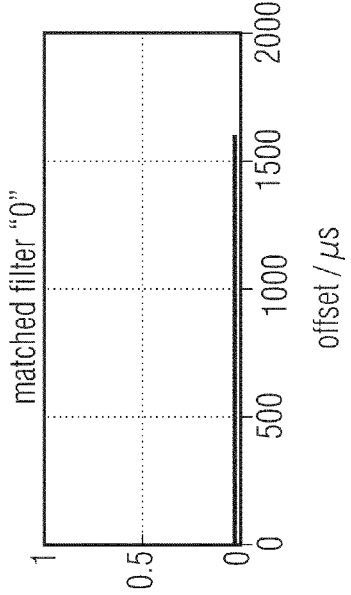
Figure 14D:
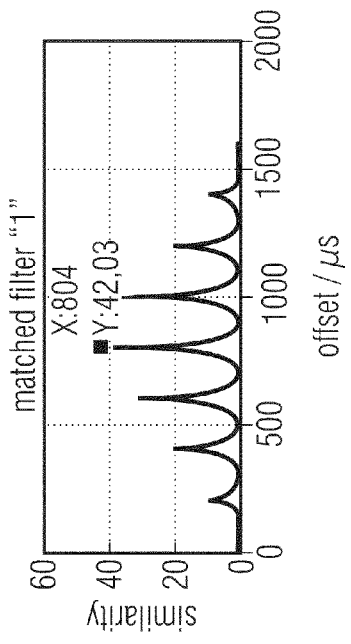

The diagrams in FIGS. 14(a) and 14(b) show the symbols for a "1" and a "0". In FIGS. 14(c) and 14(d), the respectively corresponding output signals of the filters $H_0$ and $H_1$ of FIG. 13 are depicted in a case where the respectively correct signals have been received. In the example shown, a "1" is depicted by 4 subsequent exponentially decaying pulses, a "0" being depicted in that no pulses are generated. Therefore, the matched filter $H_0$ will typically achieve a value of 0 for a "0". If a "1" is received, a maximum similarity (output signal of the matched filter) of 40 will be achieved, which means that the Euclid distance is 40. A threshold decision maker (see block 302 in FIG. 13) with a threshold of 20 would have to be employed, the optimum threshold value being difficult to adjust in practice, however, since it also varies as the signal strength and the noise vary.

Figure 15B:
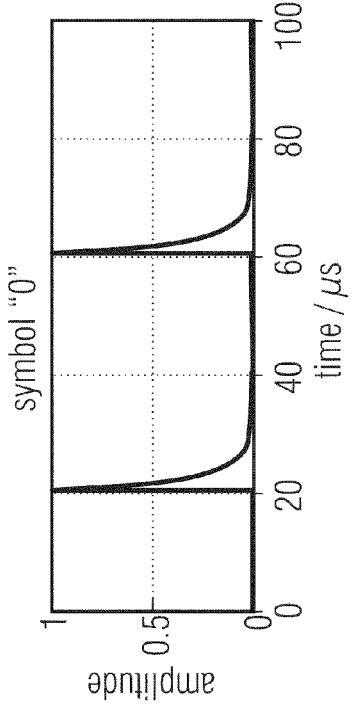
FIGS. 15(a)-(d) are representations of the symbols similar to FIG. 14 in accordance with a further embodiment.
Figure 15D:
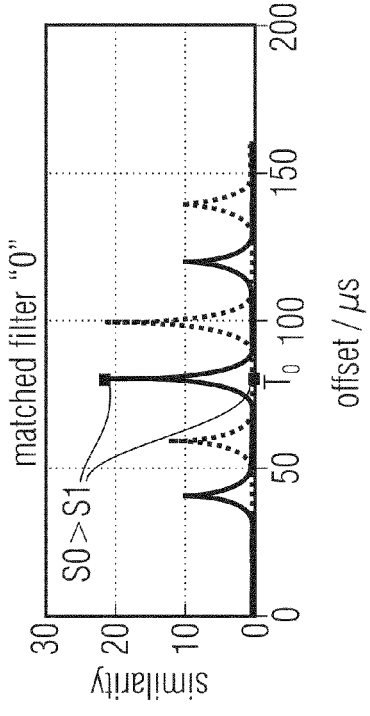
Figure 15A:
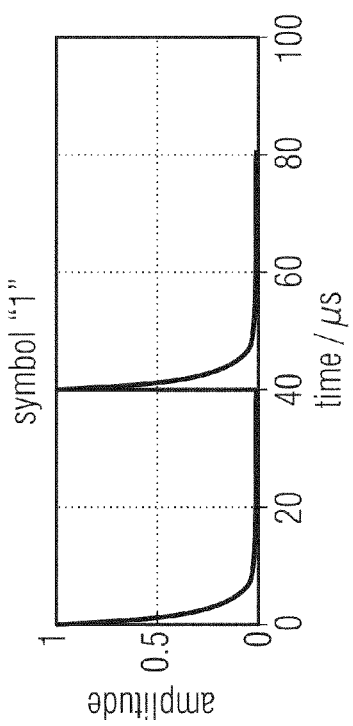
Figure 15C:
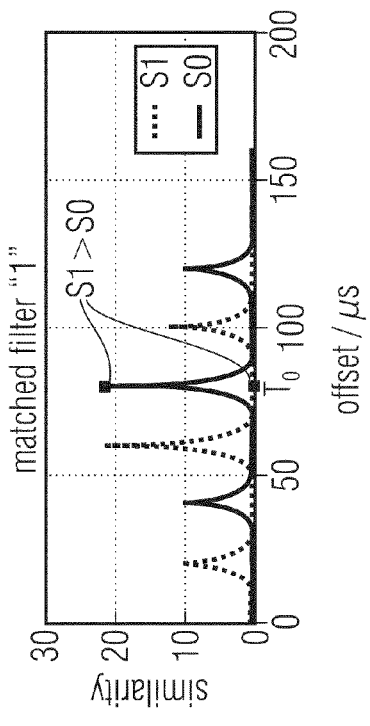

As an alternative to the symbol representation of FIG. 14, the symbol representation shown in FIG. 15 may also be employed, FIGS. 15(a) and 15(b) representing the symbols "1" and "0". A "1" consists of, alternatingly, an exponentially decaying pulse and a pause, whereas a "0" consists of, alternatingly, a pause and a pulse. The average signal energy is the same as in the first example, but both matched filters output an output signal having values above 0, so that their difference may now be evaluated. The continuous lines in FIGS. 15(c) and (d) show the output signal of the matched filter for a case where the received symbol equals the pulse response of the matched filter. The dotted lines show the case where the other symbol is received. Both matched filters may achieve a maximum value of 20, which means that the Euclid distance is again 40. However, it is no longer necessary to find a threshold, so that this representation of the symbols is advantageous, which is also advantageous in that with such symbols a matched filter improves the signal/noise ratio by about 15 dB.

The signal/noise ratio achievable with the inventive approach will be explained below. In order to estimate this, the square mean value of the generated data signal is initially useful, for which purpose the energy stored within the resonant circuit may be calculated. When assuming a maximum reading range of about 40 cm, a minimally useful voltage of 3 V will be applied across the transponder chip. This means a voltage of about 3.5 V across the resonant circuit 214 with regard to the threshold voltage of the rectifier diodes. In this example, the energy oscillates between the antenna inductance and the capacitance at a frequency of 6.78 MHz. At the point in time when the energy is fully stored in the capacitor, said energy may be calculated as follows:

$$w=0.5(C_1+C_2)U_1^2 \ldots \text{about 844 pJ.}$$

At the point in time when the energy is stored in the antenna inductance, the value of the capacitance is switched from $C_1+C_2$ to a value of $C_1$. Since the energy is constant, the voltage amplitude $U_2$ changes as follows:

$$U_2=\sqrt{(2w/C_2)} \ldots \text{about 5.52 V.}$$

The resulting transmission symbol may be considered to be a periodic, exponentially decaying sinusoidal oscillation, specifically as:

$$u_c(t)=U_2 \exp(-t/\pi)\sin(2\pi f_2 t)$$

In this embodiment, the frequency is 10.7 MHz, and the time constant $\pi$ results from the quality factor of the resonant circuit and shall be assumed as 2.76 µs. With a periodicity of t=1/50 kHz, the root-mean-square value is as follows:

$$u_{eff} \text{ is about 64.14 mV.}$$

After inserting of the corresponding values and solving the integral for calculating the root-mean-square value, the latter will be 64.14 mV. With the aid of the channel transfer function, the voltage at the receiver may be calculated. When assuming that an antenna is tuned to 10.7 MHz, there will be a transmission ratio of about 0.01917 between the transponder antenna and the receive antenna. The root-mean-square value at the receiver then will be 1.090 µV. The effective noise voltage may be calculated by integrating the spectral noise density on the basis of the above-mentioned simulations, and with a receiver input bandwidth of 300 kHz, which is useful for such signals, said effective noise voltage will be about 1.5 µV. This results in the signal/noise ratio of −2.77 dB, which is an improvement of 55.4 dB as compared to the load modulation technique (see above). Together with the matched filter, a signal/noise ratio of about +12.2 dB is therefore possible, which is above the minimum of +10 dB and, consequently, leads to an acceptable bit error rate.

Figure 16:
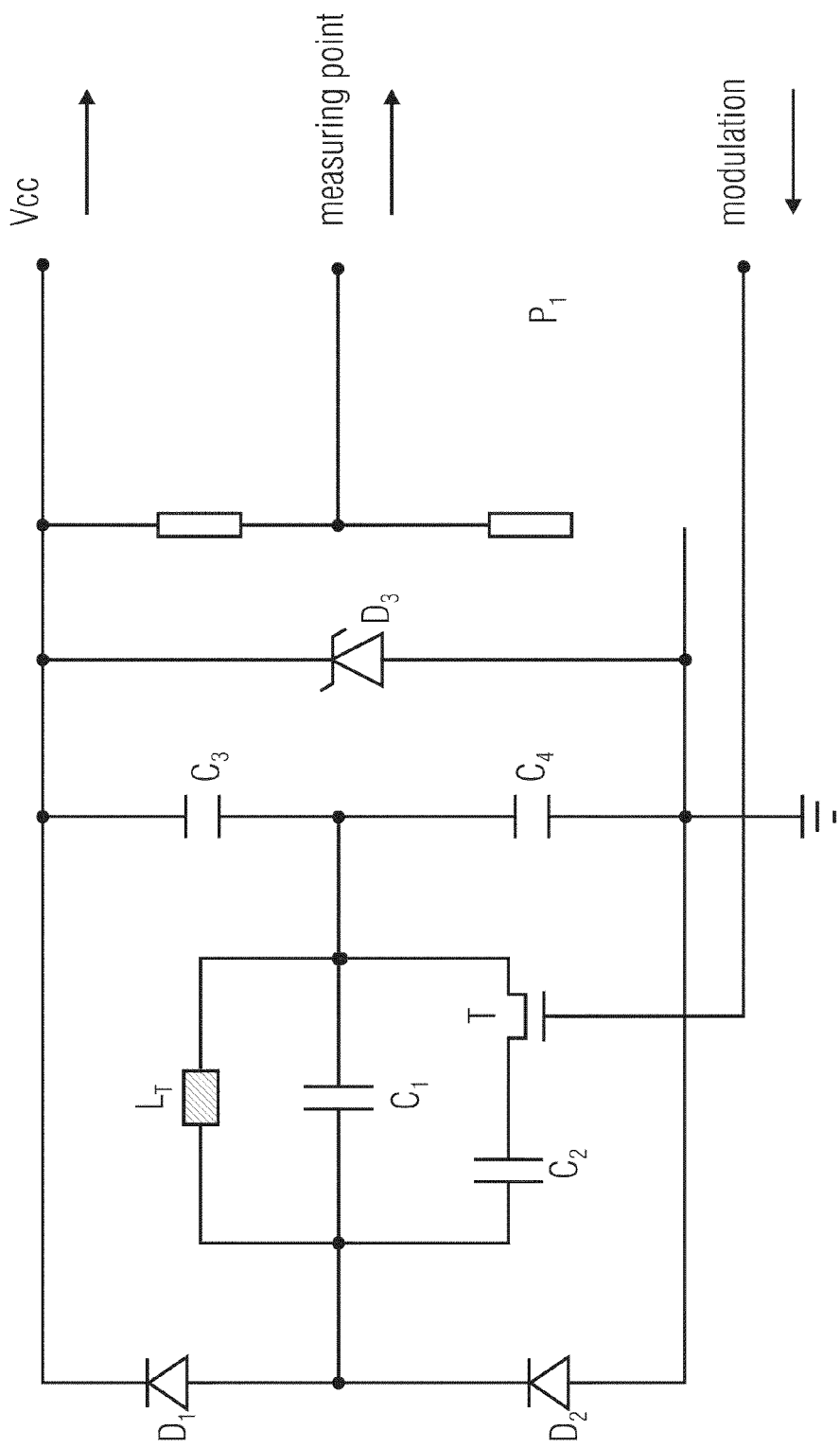
FIG. 16 depicts an equivalent circuit diagram of a passive transponder in accordance with an embodiment of the invention.

By means of FIG. 16, an equivalent circuit diagram of an implementation of the inventive passive transponder in accordance with an embodiment of the invention will be explained in more detail below. In particular, FIG. 16 shows the parallel resonant circuit consisting of the antenna coil $L_T$ and the two capacitors $C_1$ and $C_2$. The implementation shown enables switching the capacitor $C_2$ by means of a transmission gate transistor, it also being possible, alternatively, to use capacitance diodes, of course, which are less advantageous, however, since they continuously consume current, which affects an energy balance of the passive transponder.

Figures 17A, 17B:
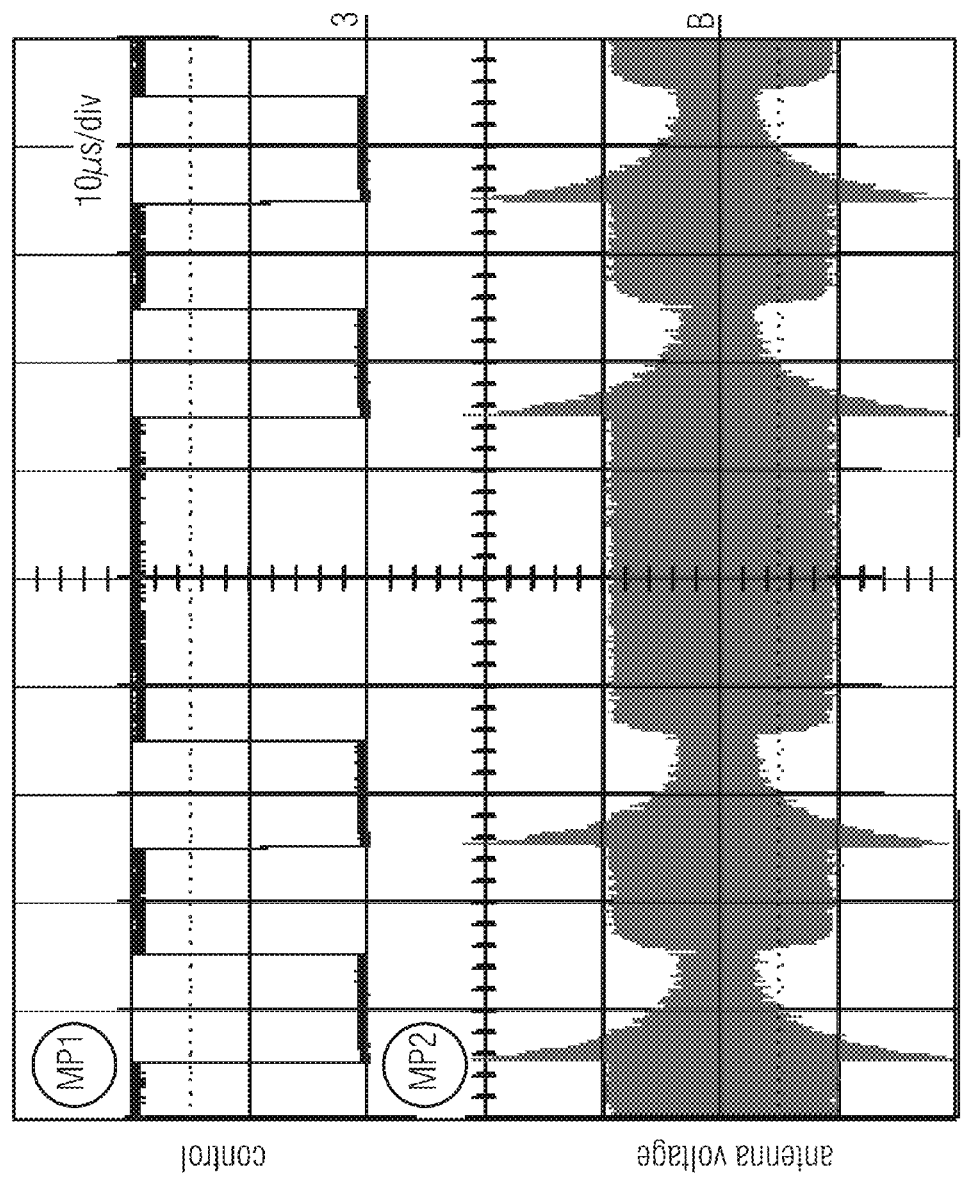
FIGS. 17(a)-(b) are representations of controlling the passive transponder in accordance with an embodiment of the invention.

As was mentioned, the parallel resonant circuit consists of the antenna coil $L_T$ and the two capacitors $C_1$ and $C_2$, and it is tuned to the frequency of the reader, e.g. to 6.78 MHz. The diodes $D_1$ and $D_2$ are arranged such that a direct voltage is generated across the capacitors $C_3$ and $C_4$, said direct voltage being used for supplying the transponder electronics with power VCC. The Zener diode $D_3$ acts as a voltage limiter in the case of small distances from the reader. With the aid of the transistor T, the capacitance $C_2$ may be switched off. In this case, the resonant circuit has a frequency of 10.7 MHz. The node between the diodes $D_1$ and $D_2$ is used for retrieving a clock signal. With the aid of a D flip-flop, the switching procedure may be synchronized with the zero crossing of the voltage across the resonant circuit, which is advantageous, since in this case the energy is fully or almost fully stored in the antenna inductance. To simulate the usefulness of the inventive sensor transponder in an attenuating environment, such as inside a human body, for example, a so-called phantom substance was created in accordance with a known formula, within which phantom substance the transponder was arranged. The microcontroller located within the transponder was programmed to transmit random data at a rate of 13 kbit/s, FIG. 17(a) showing the control signal of the microcontroller. It was with this signal that the transistor T was switched, so that with each falling edge of the signal the capacitance $C_2$ was disconnected from the resonant circuit, and a 10.7 MHz signal was generated.

In FIG. 17(b) one can see how the voltage across the antenna develops, the same signal that was described by FIG. 10 arising. The time constant π was measured to be about 1.41 µs, the difference from the size of 2.76 µs used in the simulation being explained by the non-ideal characteristics of the transistor T during the switching process and by the suboptimal synchronization. Instead of 64.14 mV, the effective voltage is about 48 mV.

Figure 18:
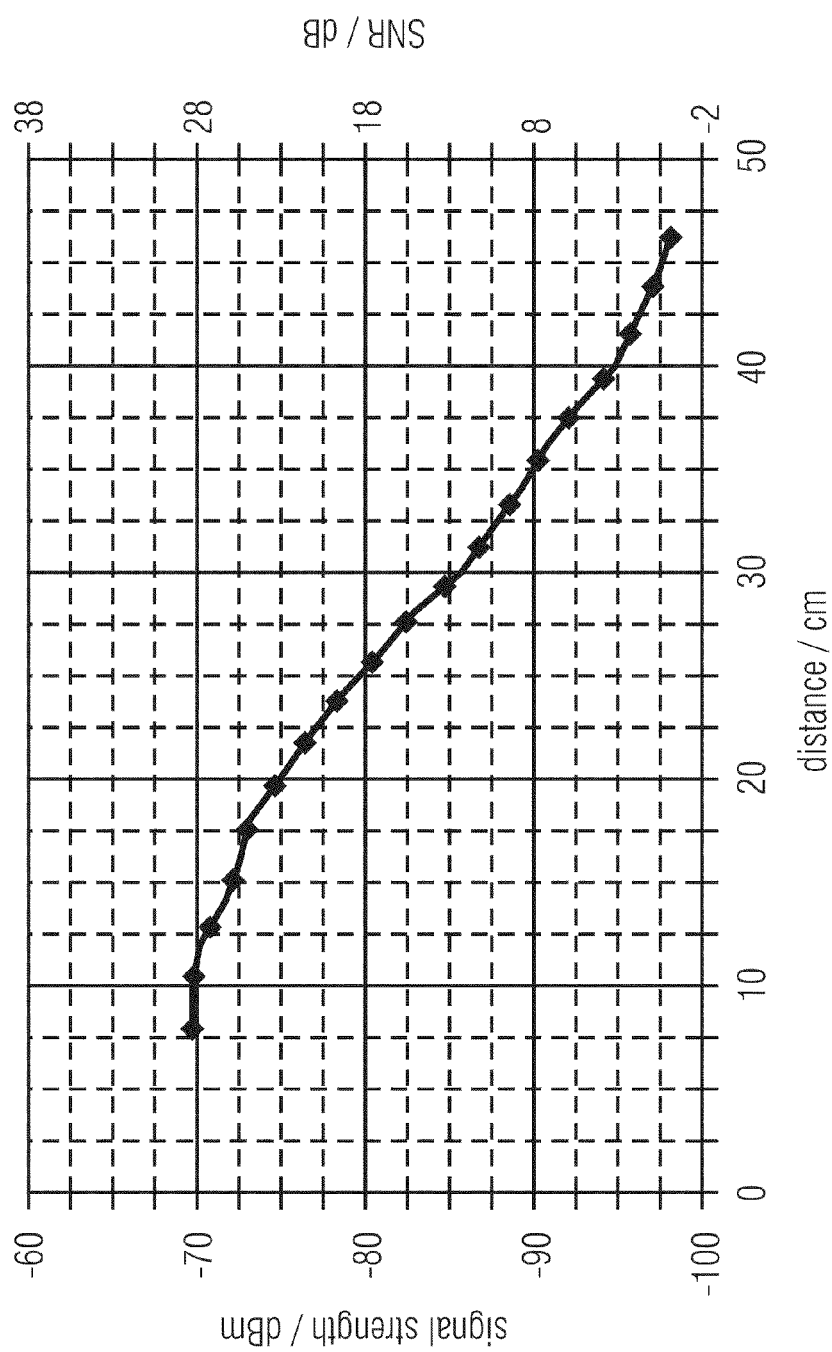
FIG. 18 is a representation of the signal strength/of the signal/noise ratio over the distance between the reader and the passive transponder.

In addition, the signal strength achievable on the reader by the present invention, and the signal/noise ratios resulting accordingly were measured. The distance between the reader and the transponder was varied between 8 cm and 46 cm, and FIG. 18 shows the measurement results. As was mentioned above, a minimum signal/noise ratio of 10 dB may be used to achieve an acceptable bit error rate. While taking into account a matched filter with a signal/noise improvement of 15 dB, a signal/noise ratio of −5 dB results at the input of the receiver—a value that is achieved even at a distance of more than 45 cm. Thus, the energy range is also 40 cm, as a result of which a maximally possible reading range is achieved.

Even though some aspects were described in connection with an apparatus, it is to be understood that said aspects also represent a description of the corresponding method, so that a block or a device of an apparatus is also to be understood as a corresponding method step or as a feature of a method step. By analogy therewith, aspects that were described in connection with or as a method step shall also represent a description of a corresponding block or detail or feature of a corresponding apparatus.

The above-described embodiments merely represent an illustration of the principles of the present invention. It is to be understood that modifications and variations of the arrangements and details described herein will be apparent to other persons skilled in the art. This is why it is intended that the invention be limited only by the scope of the following claims rather than by the specific details that were presented herein by means of the descriptions and the illustrations of the embodiments.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A passive transponder for an RFID system, comprising:
   an antenna;
   an antenna oscillator circuit; and
   a data source; wherein
   the antenna oscillator circuit is configured to:
      operate at a first resonant frequency to store, in the antenna oscillator circuit, energy received by the passive transponder; and
      operate at a second resonant frequency to generate, using only the energy stored in the antenna oscillator circuit, a data transmission signal at the second resonant frequency for a data transmission from the data source; wherein
   the antenna oscillator circuit includes a capacitive assembly and an inductive assembly;
   at least one of a capacitance value of the capacitive assembly and an inductance value of the inductive assembly is variable to switch the antenna oscillator circuit from the first resonant frequency to the second resonant frequency; and
   a controller is provided and programmed to change the capacitance value of the capacitive assembly if a predetermined portion of the energy stored within the antenna oscillator circuit is stored within the inductive assembly.

2. The passive transponder as claimed in claim 1, wherein the antenna oscillator circuit is configured to switch from the first resonant frequency to the second resonant frequency once the energy stored in the antenna oscillator circuit has reached a predetermined level.

3. The passive transponder as claimed in claim 1, wherein:
   the capacitive assembly comprises a plurality of capacitive devices, and
   the controller is programmed to switch between the first and second resonant frequencies by switching at least one of the capacitive devices of the capacitive assembly into the antenna oscillator circuit or by switching at least one of the capacitive devices of the capacitive assembly from the antenna oscillator circuit.

4. The passive transponder as claimed in claim 3, wherein the inductive assembly comprises an inductive device of the antenna.

5. The passive transponder as claimed in claim 1, wherein the capacitive assembly comprises a variable capacitive device.

6. The passive transponder as claimed in claim 1, wherein the controller is programmed to switch between the first and second resonant frequencies such that a predetermined sequence of data transmission signals is generated according to a symbol to be transmitted.

7. The passive transponder as claimed in claim 1, wherein the data source comprises at least one sensor.

8. The passive transponder as claimed in claim 7, wherein:
   the at least one sensor is configured to detect a physiological parameter of a patient, and
   the transponder is configured to be arranged on the patient's skin or inside the patient's body.

9. A transponder system comprising:
   a passive transponder for an RFID system, comprising:
      an antenna;
      an antenna oscillator circuit; and
      a data source; wherein
      the antenna oscillator circuit is configured to:
         operate at a first resonant frequency to store, in the antenna oscillator circuit, energy received by the passive transponder; and
         operate at a second resonant frequency to generate, using only the energy stored in the antenna oscillator circuit, a data transmission signal at the second resonant frequency for a data transmission from the data source;
      the antenna oscillator circuit includes a capacitive assembly and an inductive assembly;
      at least one of a capacitance value of the capacitive assembly and an inductance value of the inductive assembly is variable to switch the antenna oscillator circuit from the first resonant frequency to the second resonant frequency; and
      a controller is provided and programmed to change the capacitance value of the capacitive assembly if a predetermined portion of the energy stored within the antenna oscillator circuit is stored within the inductive assembly; and
   a reader configured to excite the passive transponder at the first resonant frequency and to receive the data transmission signal from the passive transponder at the second resonant frequency.

10. The transponder system as claimed in claim 9, wherein the reader comprises an antenna tunable between the first resonant frequency and the second resonant frequency, or a transmit antenna operating at the first resonant frequency and a receive antenna operating at the second resonant frequency.

11. The transponder system as claimed in claim 9, wherein the reader is configured to determine the transmitted data from the received data transmission signal from the passive transponder.

12. A method of transmitting data from a data source of a passive transponder within an RFID system, the method comprising:
   exciting the passive transponder at a first resonant frequency of an antenna oscillator circuit of the passive transponder to store, in the antenna oscillator circuit, energy received by the passive transponder; and transmitting the data by switching the first resonant frequency of the antenna oscillator circuit of the passive transponder to a second resonant frequency to generate, using only the energy stored in the antenna oscillator circuit, a data transmission signal at the second resonant frequency; wherein the antenna oscillator circuit includes a capacitive assembly and an inductive assembly;

at least one of a capacitance value of the capacitive assembly and an inductance value of the inductive assembly is variable to switch the antenna oscillator circuit from the first resonant frequency to the second resonant frequency; and a controller is provided and programmed to change the capacitance value of the capacitive assembly if a predetermined portion of the energy stored within the antenna oscillator circuit is stored within the inductive assembly.

* * * * *